United States Patent
Tan et al.

(10) Patent No.: US 10,840,253 B2
(45) Date of Patent: Nov. 17, 2020

(54) INCREASED GATE COUPLING EFFECT IN MULTIGATE TRANSISTOR

(71) Applicant: GLOBALFOUNDRIES Singapore Pte. Ltd., Singapore (SG)

(72) Inventors: Shyue Seng Tan, Singapore (SG); Kiok Boone Elgin Quek, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/695,445

(22) Filed: Nov. 26, 2019

(65) Prior Publication Data
US 2020/0098769 A1 Mar. 26, 2020

Related U.S. Application Data

(62) Division of application No. 15/730,742, filed on Oct. 12, 2017, now Pat. No. 10,580,781.

(51) Int. Cl.
*H01L 27/11521* (2017.01)
*H01L 29/788* (2006.01)
(Continued)

(52) U.S. Cl.
CPC .... *H01L 27/11521* (2013.01); *H01L 27/1159* (2013.01); *H01L 27/11524* (2013.01);
(Continued)

(58) Field of Classification Search
CPC ......... H01L 27/11521; H01L 29/78391; H01L 29/516; H01L 29/6684; H01L 29/66825
See application file for complete search history.

(56) References Cited

U.S. PATENT DOCUMENTS 7,317,634 B2 * 1/2008 Kawamura ........ G11C 16/0491
  365/185.14
7,655,970 B2 * 2/2010 Kuo .................. H01L 29/66825
  257/319
(Continued)

OTHER PUBLICATIONS

Salahuddin et al., "Use of Negative Capacitance to Provide Voltage Amplification for Low Power Nanoscale Devices", Nano Lett. 2008, 8, 2, 405-410.
(Continued)

*Primary Examiner* — Zandra V Smith
*Assistant Examiner* — Abbigale A Boyle
(74) *Attorney, Agent, or Firm* — Thompson Hine LLP; Anthony Canale

(57) ABSTRACT

Devices and methods of forming a device are disclosed. The device includes a substrate defined with at least a device region. A multi-gate transistor disposed in the device region which includes first and second gates both having first and second gate sidewalls. The multi-gate transistor also includes first source/drain (S/D) regions disposed adjacent to the first gate sidewall of the first and second gate, a common second S/D region disposed adjacent to the second gate sidewall of the first and second gate. A negative capacitance element is disposed within the second gate to reduce total overlap capacitance of the transistor. An interlevel dielectric (ILD) layer is disposed over the substrate and covering the transistor. First and second contacts are disposed in the ILD layer which are coupled to the first and second S/D regions respectively.

20 Claims, 21 Drawing Sheets

(51) Int. Cl.

| | | |
|---|---|---|
| *H01L 29/49* | (2006.01) | |
| *H01L 29/51* | (2006.01) | |
| *H01L 29/423* | (2006.01) | |
| *H01L 29/10* | (2006.01) | |
| *H01L 49/02* | (2006.01) | |
| *H01L 29/66* | (2006.01) | |
| *H01L 29/78* | (2006.01) | |
| *H01L 29/08* | (2006.01) | |
| *H01L 21/28* | (2006.01) | |
| *H01L 27/1159* | (2017.01) | |
| *H01L 27/11558* | (2017.01) | |
| *H01L 27/11524* | (2017.01) | |

(52) U.S. Cl.
CPC ........ *H01L 27/11558* (2013.01); *H01L 28/55* (2013.01); *H01L 28/60* (2013.01); *H01L 29/0847* (2013.01); *H01L 29/1095* (2013.01); *H01L 29/40111* (2019.08); *H01L 29/40114* (2019.08); *H01L 29/42324* (2013.01); *H01L 29/42328* (2013.01); *H01L 29/4916* (2013.01); *H01L 29/513* (2013.01); *H01L 29/516* (2013.01); *H01L 29/6684* (2013.01); *H01L 29/66825* (2013.01); *H01L 29/788* (2013.01); *H01L 29/7881* (2013.01); *H01L 29/78391* (2014.09); *H01L 29/517* (2013.01)

(56) References Cited

U.S. PATENT DOCUMENTS

| | | | | |
|---|---|---|---|---|
| 7,759,721 | B2* | 7/2010 | Kuo | H01L 29/42328 257/315 |
| 8,878,281 | B2* | 11/2014 | Huang | H01L 29/42328 257/321 |
| 9,859,290 | B1* | 1/2018 | Wang | H01L 27/11521 |
| 9,911,847 | B1* | 3/2018 | Chin | H01L 29/42344 |
| 2006/0145254 | A1 | 7/2006 | Buh et al. | |
| 2009/0134453 | A1 | 5/2009 | Govoreanu et al. | |
| 2010/0044773 | A1* | 2/2010 | Ishigaki | H01L 27/11521 257/320 |
| 2011/0101438 | A1 | 5/2011 | Yoo et al. | |
| 2013/0026552 | A1 | 1/2013 | Toh et al. | |
| 2018/0076334 | A1* | 3/2018 | Ando | H01L 29/40111 |

OTHER PUBLICATIONS

Salahuddin et al., "Can the subthreshold swing in a classical FET be lowered below 60 mV/decade?," 2008 IEEE International Electron Devices Meeting, San Francisco, CA, 2008, pp. 1-4.

Salahuddin et al., "Use of negative capacitance to provide a sub-threshold slope lower than 60 mV/decade" Submitted on Jul. 13, 2007, arXiv:0707.2073.

F. Torricelli, L. Milani, A. Richelli, L. Colalongo, M. Pasotti and Z. M. Kovacs-Vajna, "Half-MOS Single-Poly EEPROM Cell in Standard CMOS Process," in IEEE Transactions on Electron Devices, vol. 60, No. 6, pp. 1892-1897, Jun. 2013.

* cited by examiner

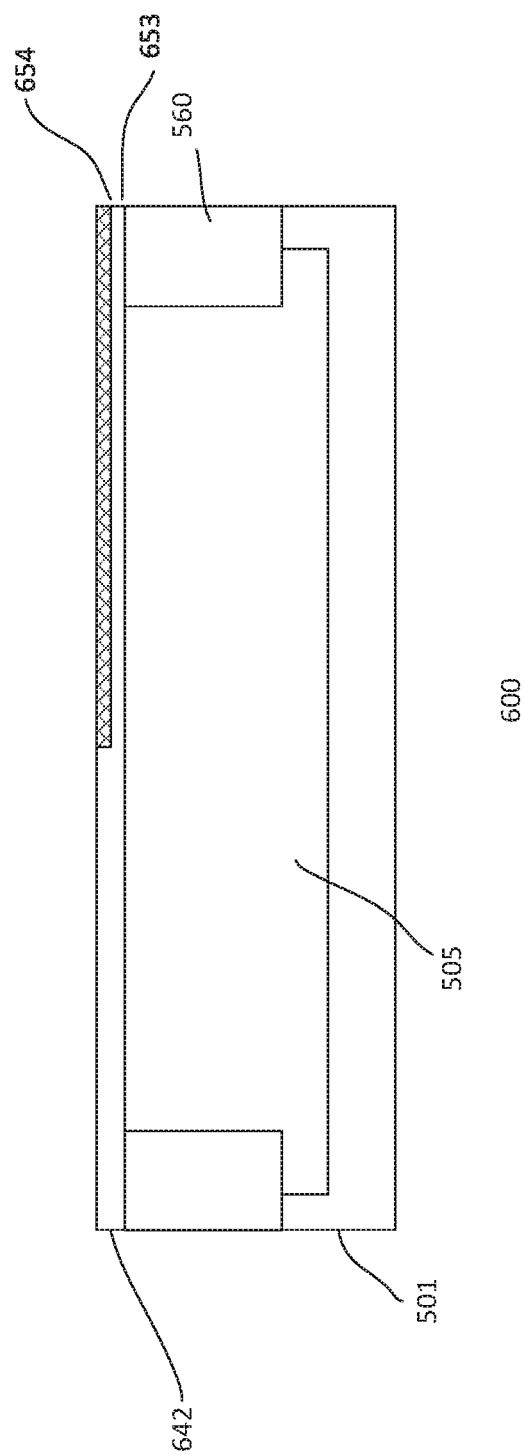

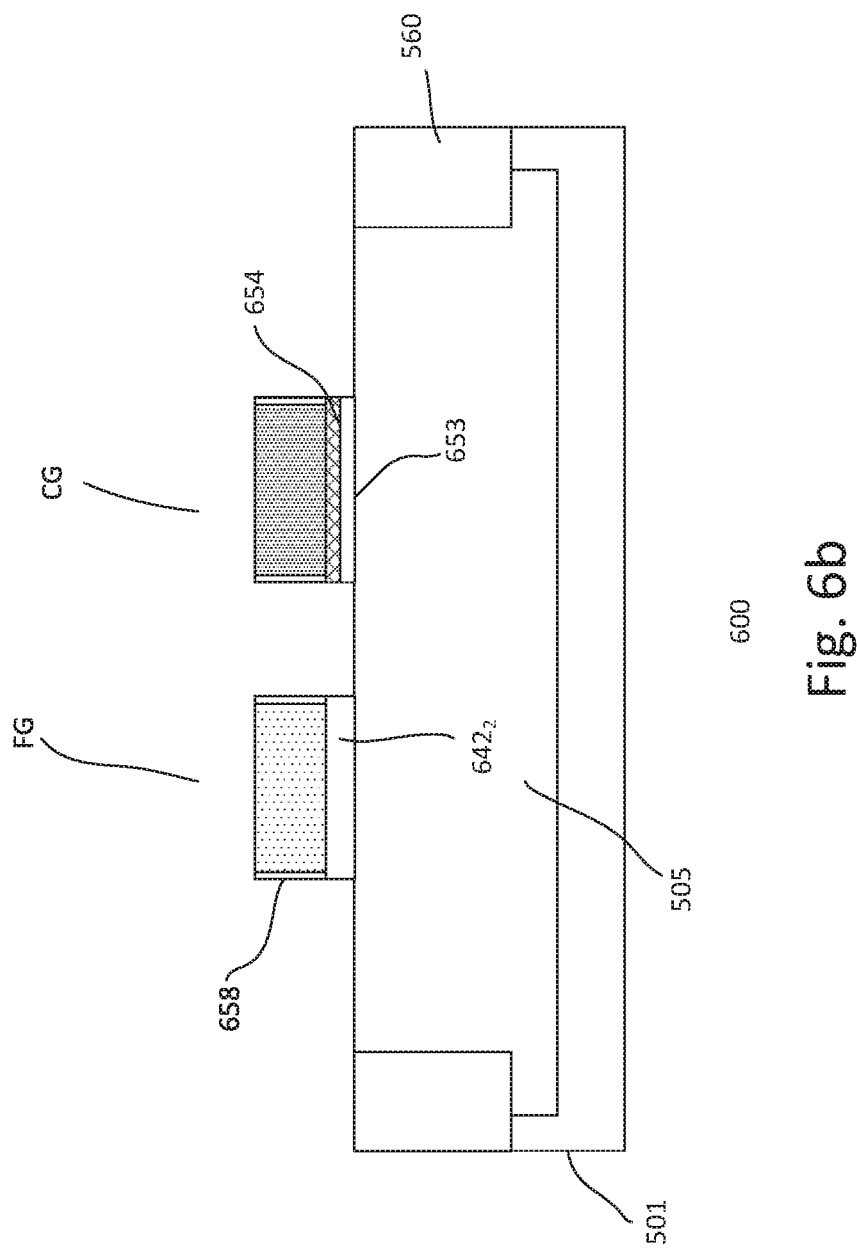

US 10,840,253 B2

INCREASED GATE COUPLING EFFECT IN MULTIGATE TRANSISTOR

BACKGROUND

Non-volatile memory (NVM) devices have achieved widespread adoptions for code and data storage applications. An advantage of NVM devices is that they are able to retain stored data even when the power supply is interrupted. NVM devices include flash devices which can be programmed using electrical signals. A NVM cell, for example, includes a control gate (CG) and a floating gate (FG) coupled in series. The FG stores data programmed into the memory cell, while the CG selects the memory cell to be programmed or erased. Charges are stored or discharged from the FG, representing first and second states of the memory cell.

An important aspect for performance is to have high gate coupling ratio between the FG and CG to improve performance as well as reduce power consumption and cell size. However, conventional NVM devices can only achieve a gate coupling ratio of about 0.7-0.8. Such low coupling ratio limits the scalability of conventional NVM devices. In addition, low coupling ratio results in increased power consumption as well as reduced performance. For example, low gate coupling ratio results in a longer program or erase time for NVM devices.

The present disclosure is directed to a NVM cell with high gate coupling ratio to improve scalability, performance and lower power consumption.

SUMMARY

Embodiments of the present disclosure generally relate to semiconductor devices or integrated circuits (ICs) and methods for forming the devices. In one embodiment, a device includes a multi-gate transistor disposed in at least a device region disposed in a substrate. The transistor includes first and second gates having first and second gate sidewalls, a first source/drain (S/D) region disposed adjacent to the first gate sidewall of the first gate and a second S/D region disposed adjacent to the second gate sidewall of the second gate. A negative capacitance element is disposed within the second gate to reduce total overlap capacitance of the transistor. An interlevel dielectric (ILD) layer is disposed on the substrate, covering the transistor and includes first and second contacts coupled to the first and second S/D regions.

In another embodiment, a method for making the device includes forming a multi-gate transistor in at least a device region in a substrate. Forming the multi-gate transistor includes forming first and second gate having first and second gate sidewalls, disposing a first S/D region adjacent to the first gate sidewall of the first gate and a second S/D region adjacent to the second gate sidewall of the second gate. The method also includes disposing a negative capacitance element within the second gate to reduce total overlap capacitance of the multi-gate transistor. The method proceeds with forming an ILD layer on the substrate covering the multi-gate transistor and forming first and second contacts in the ILD layer coupled to the first and second S/D regions.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-6c show cross-sectional views of a process for forming another embodiment of a device.

DETAILED DESCRIPTION

Embodiments generally relate to devices, for example, semiconductor devices or integrated circuits (ICs). More particularly, embodiments relate to ICs with non-volatile memory (NVM) devices with a high gate coupling ratio. The ICs can be any type of ICs, such as stand-alone NVM devices or ICs embedded with NVM devices. Other types of devices may also be useful. The devices or ICs can be incorporated into or used with, for example, consumer electronic products, or other types of products.

The fabrication of devices may involve the formation of features on a substrate that make up circuit components, such as transistors, resistors and capacitors. The devices are interconnected, enabling the IC to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1A:
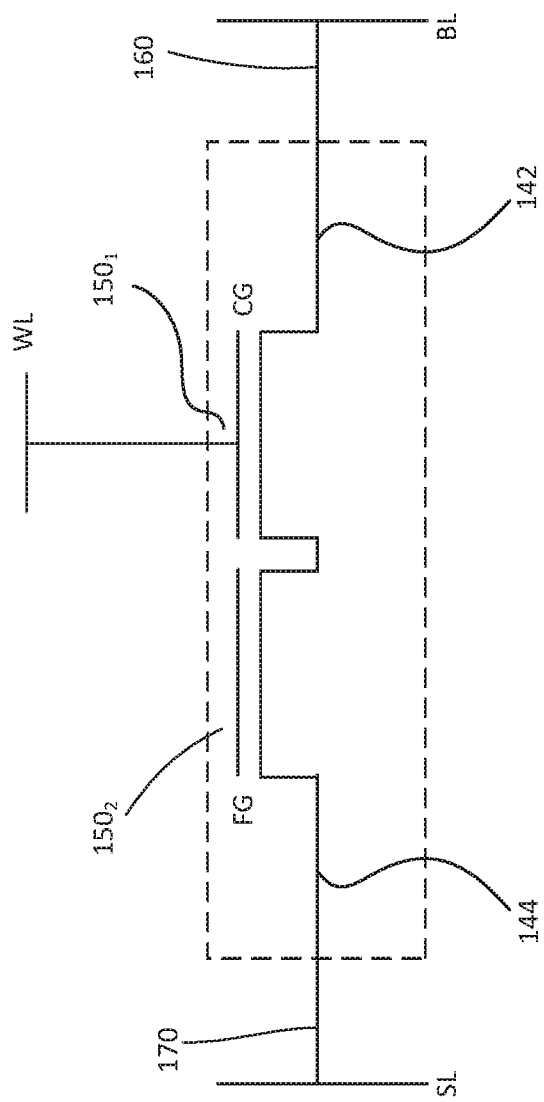
FIGS. 1a-1c show various embodiments of non-volatile memory (NVM) cells.

FIG. 1a shows a simplified schematic diagram of an embodiment of a device 100. The device is a non-volatile memory (NVM) cell. The memory cell may be a multi-gate metal oxide semiconductor field effect transistor (MOSFET). In one embodiment, the memory cell includes multiple gates with a high gate coupling ratio. Other suitable types of memory cells may also be useful.

As shown, the memory cell includes first and second gates $150_1$ and $150_2$ disposed between first and second cell terminals 160 and 170. The first gate serves as a control gate (CG) and the second gate serves as a floating gate (FG). In one embodiment, the first and second gates are disposed between first and second source/drain (S/D) regions or terminals and in close proximity to each other. As shown, no S/D region is provided between the first and second gates. The gates, for example, are coupled by proximity coupling. The first S/D region 142 is disposed adjacent to a first side of the first gate and the second S/D region 144 is disposed adjacent to a second side of the second gate. In alternative embodiments, a gate may be disposed between first and second S/D regions or terminals. For example, the first gate may be disposed between first and second S/D regions; the second gate may be disposed between first and second S/D regions. The first and second gates may include a common second S/D region. Providing other configurations for the gates and S/D regions or terminals may also be useful.

The FG includes a FG electrode and a FG dielectric. The FG electrode may be a polysilicon FG electrode. As for the FG dielectric, it may be a thermal silicon oxide FG dielectric. The FG dielectric stores or discharge charges, representing first and second states of the NVM cell. The CG includes a CG electrode and a CG dielectric. The CG electrode may be a polysilicon CG electrode. In one embodiment, the CG dielectric is a composite CG dielectric having first and second CG dielectrics. The first CG dielectric is below the second CG dielectric. In one embodiment, the first CG dielectric is a thermal silicon oxide gate dielectric and the second CG dielectric is a ferroelectric gate dielectric. The ferroelectric gate dielectric may be barium-titanium oxide ($BaTiO_3$). Other types of ferroelectric dielectrics, such as hafnium-zirconium oxide ($HfZrO_2$) or doped hafnium oxide ($HfO_2$) may also be used as the ferroelectric gate dielectric. Doped hafnium oxide may include tetragonal $HfO_2$, such as Si:$HfO_2$, or tetragonal hafnium oxide, such as Al:$HfO_2$.

The first terminal of the first gate may serve as the first cell terminal while the first terminal of the second gate may serve as the second cell terminal. The first cell terminal is coupled to a bitline (BL) and the second cell terminal is coupled to a source line (SL). The first gate serves as a control gate terminal which is coupled to a word line (WL). As for the second gate, it is a floating gate and serves as a storage gate.

As described, the CG dielectric includes a second CG ferroelectric dielectric. The second CG ferroelectric dielectric is configured to provide negative capacitance. This enables a gate coupling ratio of 1 or greater.

Figure 1B:
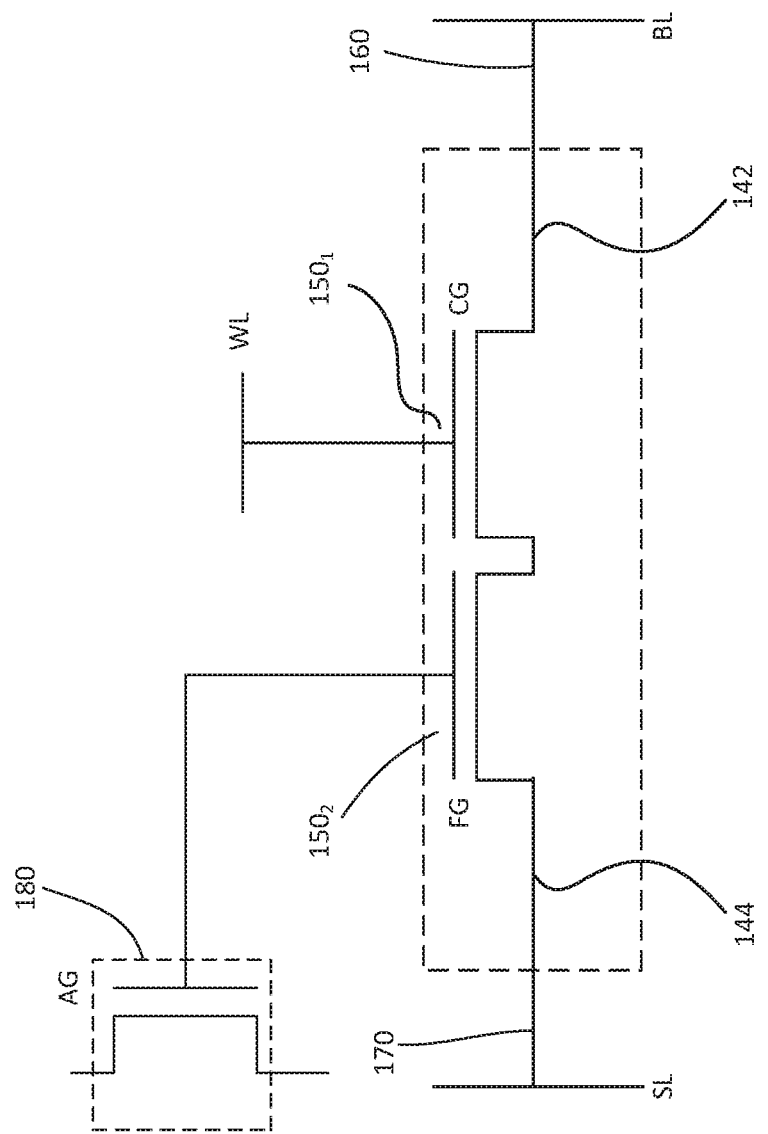

FIG. 1b shows a simplified schematic diagram of another embodiment of a device 100. The device is a NVM cell. The memory cell may be a multi-gate MOSFET. In one embodiment, the memory cell includes multiple gates with a high gate coupling ratio. Other suitable types of memory cells may also be useful.

The NVM cell is similar to that of FIG. 1a. Common elements may not be described or described in detail. The NVM cell includes first and second gates $150_1$ and $150_2$ disposed between first and second cell terminals 160 and 170. The first gate serves as a CG and the second gate serves as a FG. The FG includes a FG electrode and a FG dielectric. The FG electrode may be a polysilicon FG electrode and the FG dielectric may be a thermal silicon oxide FG dielectric. The CG includes a CG electrode and a CG dielectric. The CG electrode may be a polysilicon CG electrode and the CG dielectric may be a composite CG dielectric having first and second CG dielectrics. In one embodiment, the first CG dielectric is a thermal silicon oxide gate dielectric and the second CG dielectric is a ferroelectric gate dielectric.

In addition, the NVM cell includes a third gate 180. The third gate serves as an assist gate (AG). The AG includes an AG electrode over an AG dielectric. The AG is coupled to the FG and disposed adjacent to the second S/D region 144 of the FG and the second terminal 170 of the memory cell. The AG is disposed over an AG well in the substrate. For example, the well is biased and the AG includes ferroelectric layer disposed on the AG. In one embodiment, the AG is disposed in between first and second AG S/D terminals (not shown) and serves as a coupling capacitor for the device. For example, instead of gate coupling amplification from the top of the AG, the AG with ferroelectric dielectric is employing gate coupling amplification through the well bias.

The AG electrode may be a polysilicon AG electrode and the AG dielectric may be a composite gate dielectric having a second AG dielectric over a first AG dielectric. The first AG dielectric may be silicon oxide while the second AG dielectric may be a ferroelectric gate dielectric. The ferroelectric gate dielectric may be barium-titanium oxide ($BaTiO_3$). Other types of ferroelectric dielectrics, such as hafnium-zirconium oxide ($HfZrO_2$) or doped hafnium oxide ($HfO_2$) may also be used as the ferroelectric gate dielectric. Doped hafnium oxide may include tetragonal $HfO_2$, such as Si:$HfO_2$, or tetragonal hafnium oxide, such as Al:$HfO_2$.

As described, the CG dielectric includes a second CG ferroelectric dielectric; the AG dielectric includes a second AG ferroelectric dielectric. The ferroelectric second CG dielectric and ferroelectric second AG dielectric are configured to provide negative capacitance. This enables a gate coupling ratio of 1 or greater.

Figure 1C:
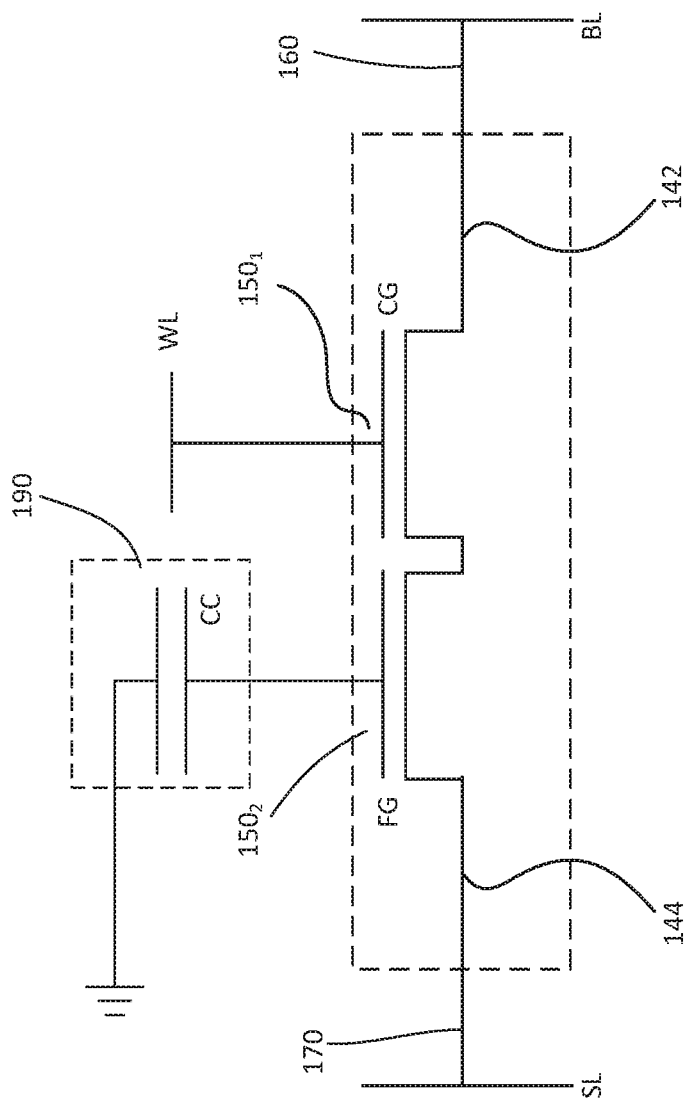

FIG. 1c shows a simplified schematic diagram of another embodiment of a device 100. The device is a NVM cell. The memory cell may be a multi-gate MOSFET. In one embodiment, the memory cell includes multiple gates with a high gate coupling ratio. Other suitable types of memory cells may also be useful.

The NVM cell is similar to that of FIGS. 1a-1b. Common elements may not be described or described in detail. The NVM cell includes first and second gates $150_1$ and $150_2$ disposed between first and second cell terminals 160 and 170. The first gate serves as a CG and the second gate serves as a FG. The FG includes a FG electrode and a FG dielectric. The FG electrode may be a polysilicon FG electrode and the FG dielectric may be a thermal silicon oxide FG dielectric. The CG includes a CG electrode and a CG dielectric. The CG electrode may be a polysilicon CG electrode and the CG dielectric may be a composite CG dielectric having first and second CG dielectrics. In one embodiment, the first CG dielectric is a thermal silicon oxide gate dielectric and the second CG dielectric is a ferroelectric gate dielectric.

In addition, the NVM cell includes a coupling capacitor (CC) 190. The coupling capacitor includes a capacitor dielectric disposed between first and second capacitor plates. One plate of the CC is coupled to the FG and the other plate is coupled to ground. For example, the first plate is coupled to ground and the second plate is coupled to the FG. The CC is disposed adjacent to the second S/D region 144 of the FG.

The first capacitor plate may be a doped well in the substrate and the second capacitor plate may be a polysilicon capacitor. Other types of capacitor plates may also be useful. As for the CC dielectric, it may be a composite capacitor dielectric, similar to that of composite AG dielectric and CG dielectric. For example, the CC dielectric includes a first capacitor dielectric over a second capacitor dielectric. The first capacitor dielectric is adjacent to the first capacitor plate and the second capacitor dielectric is adjacent to the second capacitor plate. The first capacitor dielectric may be thermal silicon oxide while the second capacitor dielectric may be a ferroelectric capacitor dielectric. The ferroelectric capacitor dielectric may be barium-titanium oxide ($BaTiO_3$). Other types of ferroelectric dielectrics, such as hafnium-zirconium oxide ($HfZrO_2$) or doped hafnium oxide ($HfO_2$) may also be used as the ferroelectric capacitor dielectric. Doped hafnium oxide may include tetragonal $HfO_2$, such as $Si:HfO_2$, or tetragonal hafnium oxide, such as $Al:HfO_2$.

As described, the CC dielectric includes a ferroelectric second CC dielectric. The ferroelectric second CC dielectric is configured to provide negative capacitance. This enables a capacitor coupling ratio of 1 or greater. For example, simulation results achieved a 25% amplification in internal voltage.

Figure 1E:
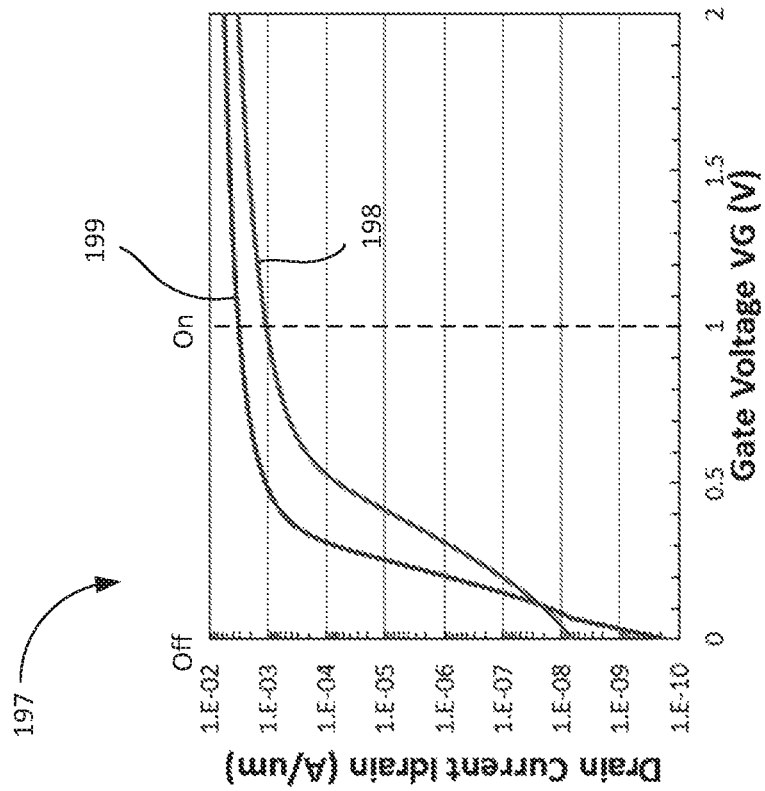
FIGS. 1d-1e show graphs of simulation results showing coupling in lateral and vertical direction for spacer units with ferroelectric and without ferroelectric liners or spacers.
Figure 1D:
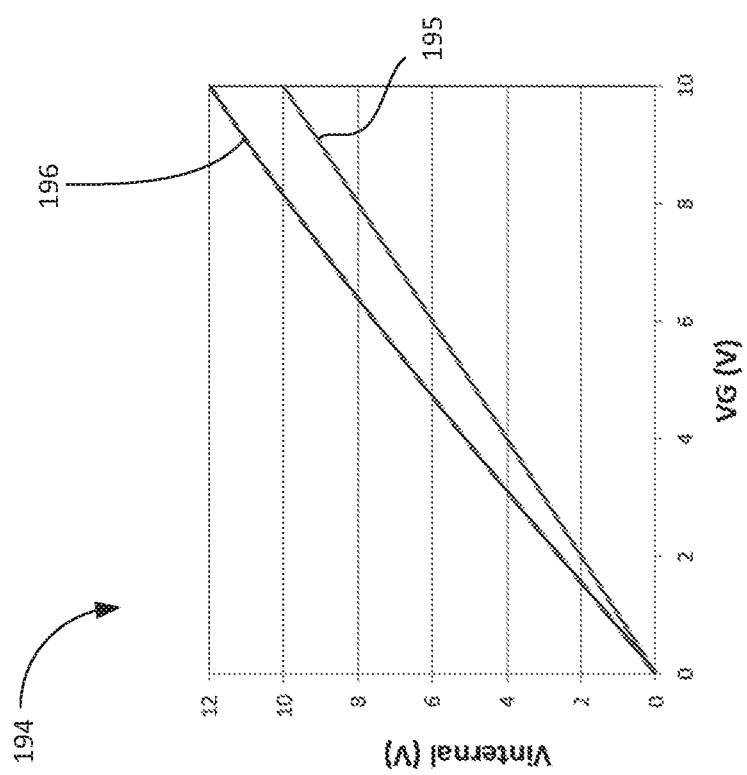

FIG. 1d shows a first graph 194 and FIG. 1e shows a second graph 197. The first graph show simulation results of lateral coupling of a device with nitride spacers of 100 nm with and without ferroelectric spacers. The second graph show simulation results of lateral coupling for a device having a gate length (Lg) of 100 nm.

Referring to the first graph, a line 196 plots the internal voltage versus the gate voltage for a device with spacer units with ferroelectric spacers and line 195 plots the internal voltage versus gate voltage of device with spacer units without ferroelectric spacers. As can be seen from the first graph, about a 25% increase in amplification in the internal voltage is achieved for devices with ferroelectric spacers over devices without ferroelectric spacers. This evidences improved lateral coupling with the use of ferroelectric spacers.

Referring to the second graph, a line 198 plots the drain current versus the gate voltage for a device with ferroelectric spacers and line 195 plots the drain current versus the gate voltage for a device without ferroelectric spacers. As can be seen from the second graph, the drain current when the device is off (La) for the device with ferroelectric spacers is lower than the device without ferroelectric spacers. As also shown, the drain current when the device is on (Ion) for the device with ferroelectric spacers is higher than the device without ferroelectric spacers. This evidences improved vertical coupling with the use of ferroelectric spacers.

Figure 2A:
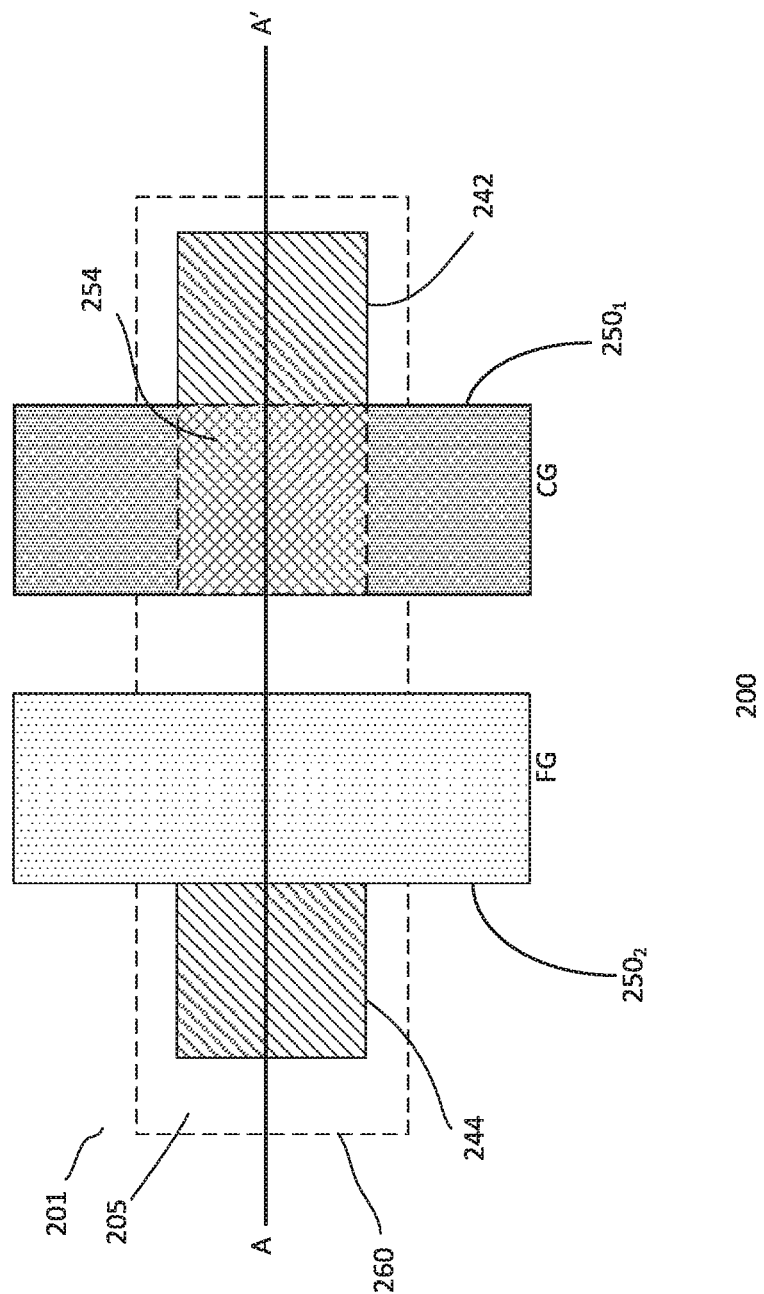
FIGS. 2a-2b show top and cross-sectional views of an embodiment of a NVM cell.
Figure 2B:
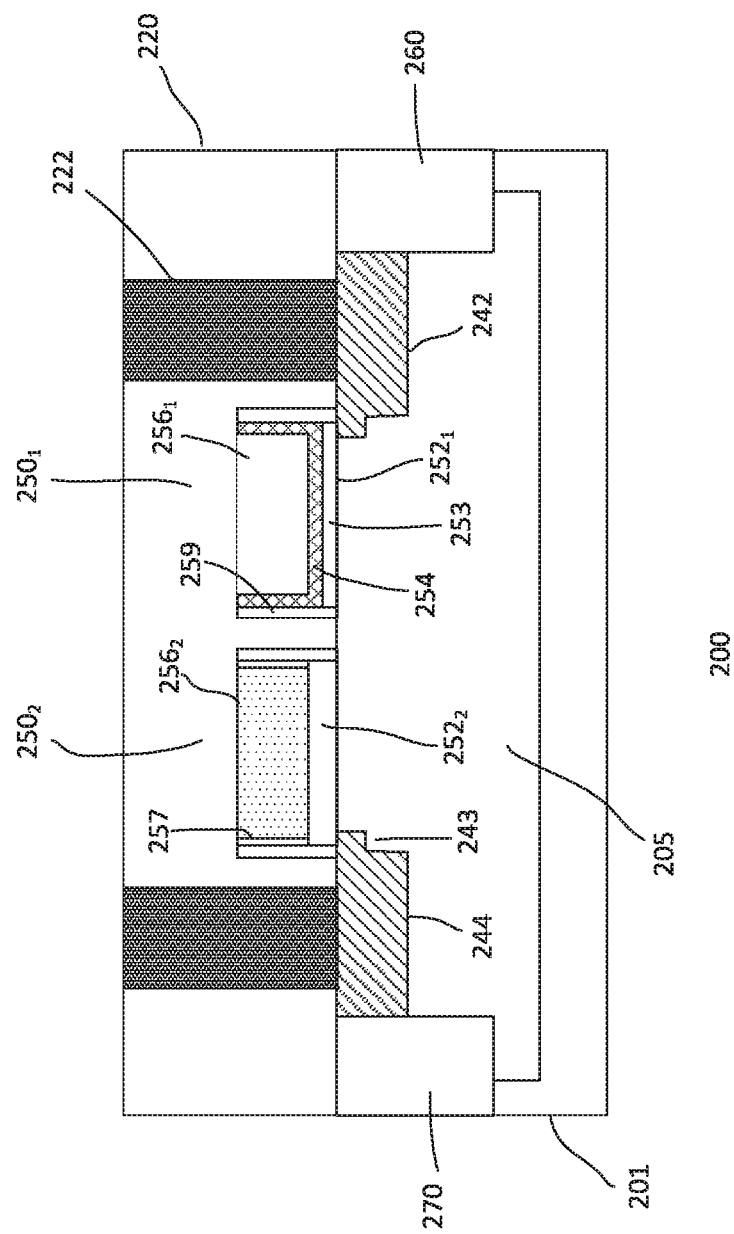

FIGS. 2a-2b show simplified top and cross-sectional views of an embodiment of a device 200. The cross-sectional view of FIG. 2b is along A-A'. The device, for example, is an integrated circuit (IC). As shown, the device includes a multi-gate NVM cell. The NVM cell is similar to the NVM cells described in FIGS. 1a-1e. Common elements may not be described or described in detail.

The NVM cell is disposed in the cell region of a substrate 201. The substrate, for example, may be a semiconductor substrate, such as a silicon substrate. Other types of substrates or wafers may also be useful. For example, the substrate may be a silicon germanium (SiGe), germanium (Ge), a gallium arsenide (GaAs), or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations, as well as an undoped substrate, may also be useful.

The cell region, for example, is part of an array region having a plurality of memory cells. The substrate may include other types of device regions. The substrate, for example, may include low voltage (LV) device regions for LV metal oxide semiconductor (MOS) transistors, medium voltage (MV) device regions for MV MOS transistors and high voltage (HV) device regions for HV MOS transistors. Other device regions may also be provided on the substrate.

The device may include doped regions having different dopant concentrations. For example, the device may include heavily doped ($x^+$), intermediately doped (x) and lightly doped (x) regions, where x is the polarity type which can be p or n. A lightly doped region may have a dopant concentration of about $1E16-1E17$ $cm^{-3}$, an intermediately doped region may have a dopant concentration of about $1E18-1E19$ $cm^{-3}$, and a heavily doped region may have a dopant concentration of about $1E20-1E21$ $cm^{-3}$. The doping concentrations, for example, are for 55 nm technology node. Providing other dopant concentrations for the different doped regions may also be useful. For example, dopant concentrations may vary depending on, for example, the technology node. P-type dopants may include boron (B), aluminum (Al), indium (In) or a combination thereof, while n-type dopants may include phosphorous (P), arsenic (As), antimony (Sb) or a combination thereof.

An isolation region 260 is provided. For example, the isolation region surrounds the cell region. The isolation region isolates the cell region from other device regions. Other isolation regions may also be provided to isolate other device regions. The isolation region may be a shallow trench isolation (STI) region. A STI region includes an isolation trench filled with isolation or dielectric materials. Other types of isolation regions may also be employed. For example, the isolation region may be a deep trench isolation (DTI) or a field oxide (FOX) isolation region. The STI regions, for example, extend to a depth of about 2000-5000 Å. Providing isolation regions which extend to other depths may also be useful.

A cell device well 205 is disposed in the substrate in the cell region. In one embodiment, the cell well is disposed within the device isolation region of cell region. In one embodiment, the depth or bottom of the device well is below the isolation region surrounding the cell region. Providing a cell well having other depths may also be useful. Other configuration of cell wells may also be useful.

The cell well includes second polarity dopants for a first polarity type NVM cell. For example, a device well includes p-type dopants for an n-type NVM cell or n-type dopants for a p-type NVM cell. The cell well may be lightly (x) or intermediately (x) doped with second polarity type dopants. Other dopant concentration may also be useful for the cell well.

A deep isolation well (not shown) may be provided for the cell region. The deep isolation well, for example, is first polarity type doped well. The deep isolation well isolates the cell well from the substrate. The substrate may include other device wells for other types of devices. For example, other device wells may be provided for other device regions of the substrate.

The NVM cell includes first and second gates $250_1$ and $250_2$ disposed on the substrate in the device region. The first gate serves as a control gate (CG) and the second gate serves as a floating gate (FG). The FG includes a FG electrode $256_2$ disposed over a FG dielectric $252_2$. The FG electrode may be a polysilicon FG electrode. As for the FG dielectric, it may be a thermal silicon oxide FG dielectric. The FG dielectric stores or discharge charges, representing first and second states of the NVM cell. The thickness of the FG electrode may be about 800-1500 Å and the thickness of the FG dielectric may be about 80-90 Å. Other thicknesses for the FG electrode and FG dielectric may also be useful.

As for the CG, it includes a CG electrode $256_1$ disposed over a CG dielectric $252_1$. The CG electrode may be a polysilicon CG electrode. In one embodiment, the CG dielectric includes a composite gate dielectric which includes a first CG dielectric 253 disposed below a second CG dielectrics 254. In one embodiment, the first CG dielectric is a thermal silicon oxide gate dielectric and the second CG dielectric is a ferroelectric gate dielectric. The ferroelectric gate dielectric may be barium-titanium oxide (BaTiO$_3$). Other types of ferroelectric dielectrics, such as hafnium-zirconium oxide (HfZrO$_2$) or doped hafnium oxide (HfO$_2$) may also be used as the ferroelectric gate dielectric. Doped hafnium oxide may include tetragonal HfO$_2$, such as Si:HfO$_2$, or tetragonal hafnium oxide, such as Al:HfO$_2$.

In one embodiment, the thickness of the second CG dielectric is optimized based on the thickness of the first CG dielectric. For example, in the simulation with a 25% increase in internal voltage amplification, the thickness of the first CG dielectric is 1.4 nm and the thickness of the second CG dielectric is 12 nm. All the sides of the ferroelectric gate dielectric have the same thicknesses. In other embodiments, the thickness of the first CG dielectric may be about 8 nm and the thickness of the second CG dielectric may be about 80 nm. Other thicknesses may also be useful.

A gate includes gate sidewall spacers 259. For example, both the FG and the CG include sidewall spacers. The sidewall spacers, for example, may be silicon nitride spacers. Other types of dielectric spacers may also be useful. In one embodiment, the FG includes sidewall oxidation 257. The sidewall oxidation is disposed between the sidewall spacers and FG electrode sidewalls. In one embodiment, the CG is a gate last process CG. For example, the CG is formed at the end using a dummy CG. As such, the second CG dielectric lines the sidewalls and bottom of the CG electrode.

In one embodiment, the first and second gates are disposed in very close proximity to each other. In such case, the adjacent gate sidewall spacers of the gates may abut. Providing other configuration, such as having a common gate sidewall spacer shared between the first and second gates, may also be useful. In some embodiments, with the close proximity between the first and second gates, there may be no LD extension region and/or heavily doped S/D region disposed in between the first and second gate. For example, there is no doped LD extension and S/D regions shared between the first and second gates. Such configuration allows for improvement in lateral coupling between the gates.

Alternatively, a gate may be disposed between first and second source/drain (S/D) regions or terminals. For example, the first gate may be disposed between first and second S/D regions; the second gate may be disposed between first and second S/D regions. The first and second gates may include a common second S/D region. The S/D regions are heavily doped first polarity type doped regions. In one embodiment, a S/D region includes lightly doped (LD) extension regions 243. The LD extension region extends under the gate while the heavily doped S/D regions is aligned with the spacers. For example, the gate sidewall spacers facilitate in forming the S/D regions.

In one embodiment, the first S/D regions of the gates serves as cell terminals of the NVM cell. The first S/D region of the CG serves as a first cell terminal and the second S/D region serves as a second cell terminal. The S/D regions and gate electrodes may include metal silicide contacts, such as nickel-based silicide contacts. Other types of metal silicide contacts may also be useful.

A contact dielectric layer 220 is disposed over the substrate, covering the substrate and gates. The contact dielectric layer may be a silicon oxide layer formed by chemical vapor deposition (CVD). Other types of dielectric layers may also be useful. The contact dielectric layer, for example, serves as the first contact level of a BEOL dielectric layer having a plurality of interlevel dielectric (ILD) levels. An ILD level includes a contact or via dielectric layer below a metal level dielectric layer. Contacts are disposed in the contact dielectric layer and metal lines are disposed in the metal level dielectric layer. As shown, contacts 222 are disposed in the contact dielectric layer. The contacts are coupled to the cell terminals. In addition, a contact may be provided which is coupled to the CG.

The contact to the first cell terminal is coupled to a bitline (BL) in a metal level above, the contact to the second cell terminal is coupled to a source line (SL) in a metal level above and the contact coupled to the CG is coupled to a word line (WL) in a metal level above. Lines which are perpendicular, such as WL and BL, are provided on different metal levels.

As discussed, the CG includes a ferroelectric second CG dielectric which produces negative capacitance to increase gate coupling ratio. In one embodiment, the thickness of the second CG dielectric is selected to produce a gate coupling ratio of ≥1. Preferably, the gate coupling ratio is and over 1.25. In one embodiment, the thickness of the ferroelectric second CG dielectric is optimized based on the thickness of the first CG dielectric. For example, in the simulation with a 25% increase in internal voltage amplification due to increase gate coupling ratio by the negative capacitance, the thickness of the ferroelectric first CG dielectric is 1.4 nm and the thickness of the second CG dielectric is 12 nm. Other thicknesses may also be useful.

Figure 3A:
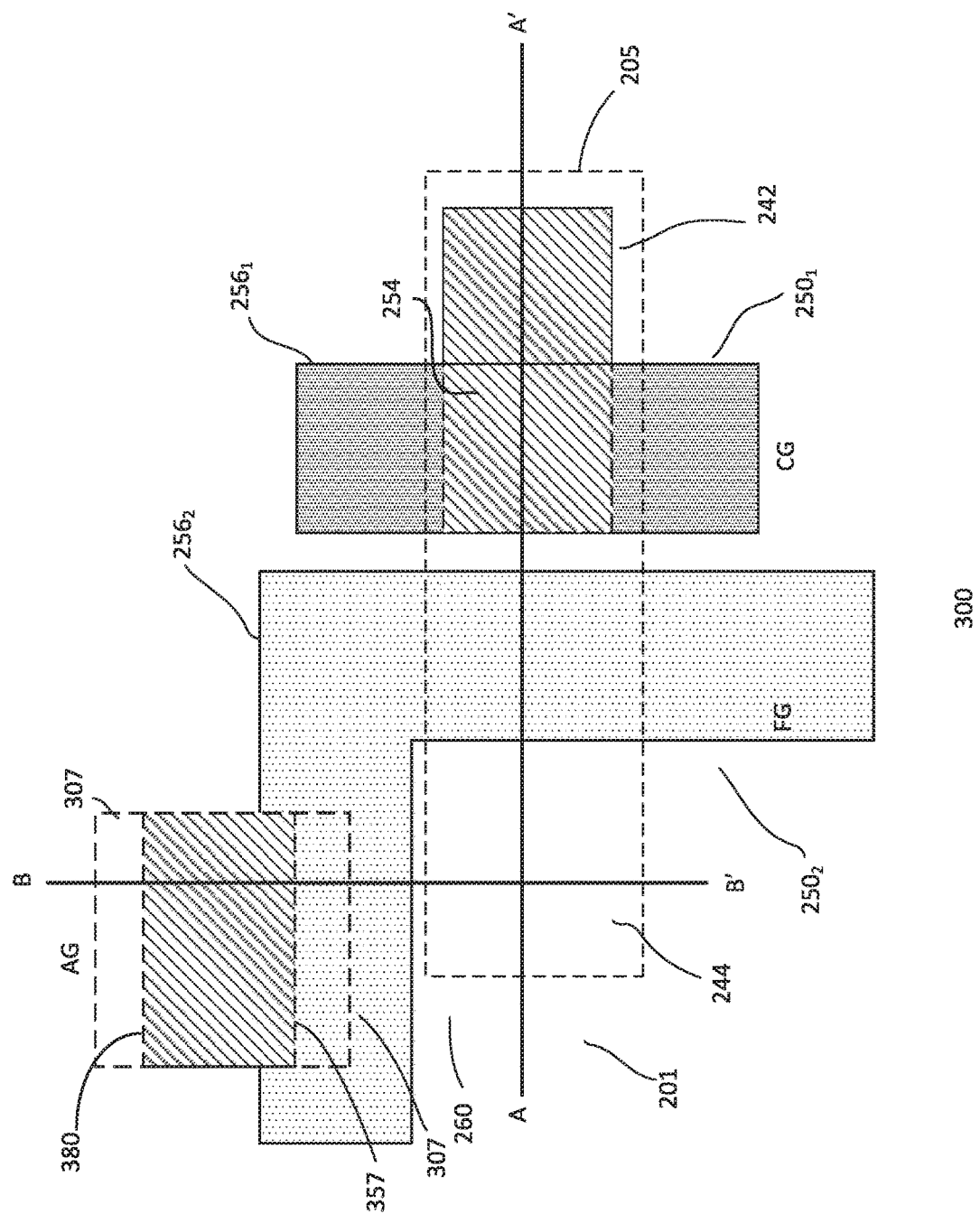
FIGS. 3a-3c show top and cross-sectional views of another embodiment of a NVM cell.
Figure 3B:
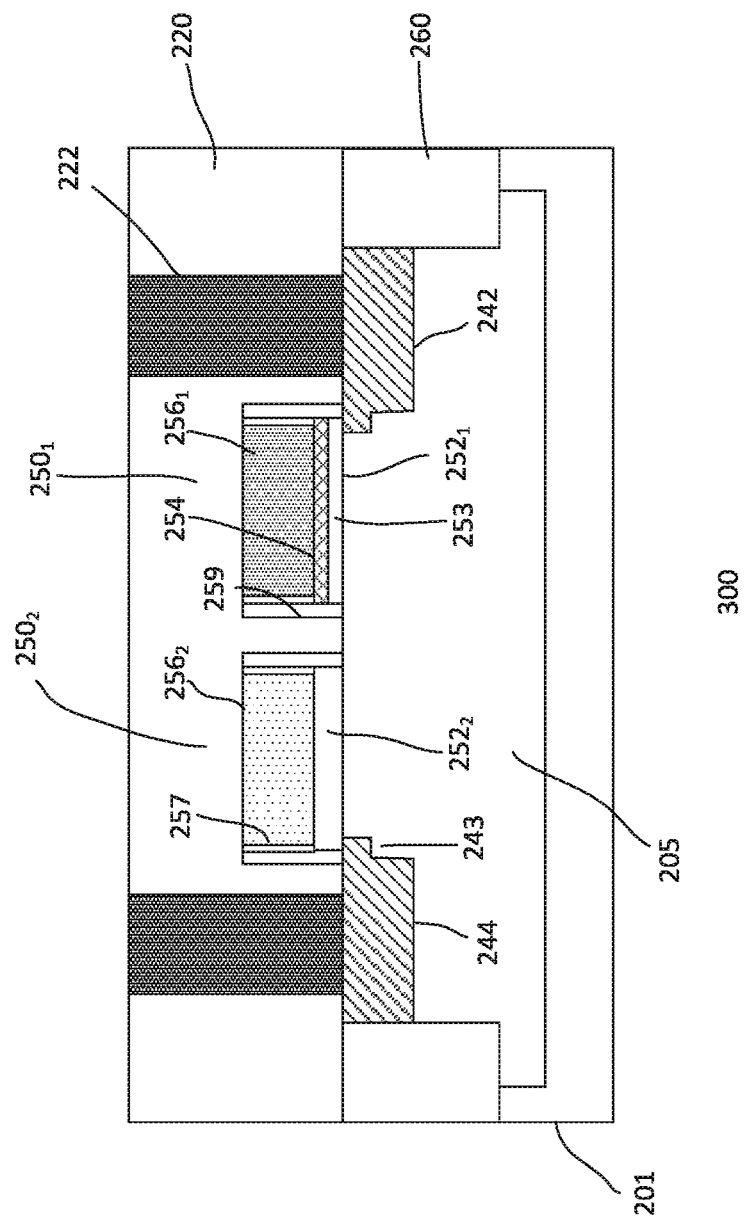
Figure 3C:
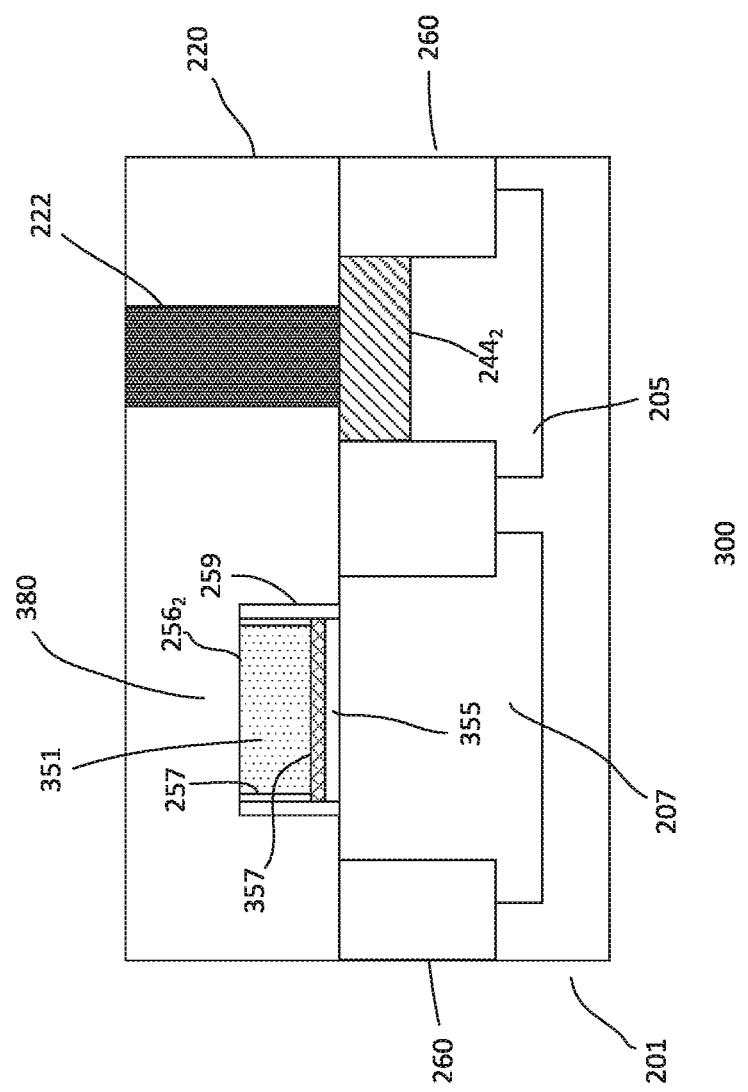

FIGS. 3a-3c show simplified top and cross-sectional views of an embodiment of a device 300. The cross-sectional view of FIG. 3b is along A-A' and the cross-sectional view of FIG. 3c is along B-B'. The device, for example, is an integrated circuit (IC). As shown, the device includes a multi-gate NVM cell. The NVM cell is similar to the NVM cells described in FIGS. 1a-1c and FIGS. 2a-2b. Common elements may not be described or described in detail.

The NVM cell is disposed in the cell region of a substrate 201. The cell region, for example, is part of an array region having a plurality of memory cells. The substrate may include other types of device regions. An isolation region 260, such as an STI region, surrounds the cell region to isolate it from other device regions.

A cell device well 205 is disposed in the substrate in the cell region. A deep isolation well (not shown) may be provided for the cell region. The deep isolation well isolates the cell well from the substrate. The substrate may include other device wells for other types of devices. For example, other device wells may be provided for other device regions of the substrate.

The NVM cell includes a CG $250_1$ and a FG $250_2$ disposed on the substrate in the device region. The FG includes a FG electrode $256_2$ disposed over a FG dielectric $252_2$. The FG electrode may be a polysilicon FG electrode. As for the FG dielectric, it may be a thermal silicon oxide FG dielectric. As for the CG, it includes a CG electrode $256_1$ disposed over a CG dielectric $252_1$. The CG electrode may be a polysilicon CG electrode. The CG and FG electrodes may be formed from the same polysilicon layer. The CG dielectric includes a composite gate dielectric which includes a thermal silicon oxide first CG dielectric 253 disposed below a ferroelectric second CG dielectrics 254.

A gate includes dielectric gate sidewall spacers 259. For example, both the FG and the CG include gate sidewall spacers. In one embodiment, the CG and FG includes sidewall oxidation 257. The sidewall oxidation in the CG is disposed between the gate sidewall spacers and CG electrode sidewalls. The sidewall oxidation in the FG is disposed between the gate sidewall spacers and the FG electrode sidewalls.

As shown, the memory cell includes first and second gates $250_1$ and $250_2$ disposed between first and second cell terminals 260 and 270. The first gate serves as a CG and the second gate serves as a FG. In one embodiment, the first and second gates are disposed in very close proximity to each other and between first and second S/D regions or terminals and in close proximity to each other with no common S/D regions therebetween. For example, the first S/D region 242 is disposed adjacent to a first side of the first gate and the second S/D region 244 is disposed adjacent to a second side of the second gate. In some embodiments, a gate may be disposed between first and second S/D regions. For example, the first gate may be disposed between first and second S/D regions; the second gate may be disposed between first and second S/D regions. The first and second gates may include a common second S/D region. Providing other configurations for the gates and S/D regions or terminals may also be useful. The S/D regions are heavily doped first polarity type doped regions. In one embodiment, a S/D region includes lightly doped (LD) extension regions 243. The LD extension region extends under the gate while the heavily doped S/D regions is aligned with the spacers. For example, the gate sidewall spacers facilitate in forming the S/D regions.

In one embodiment, the NVM cell includes an AG 380 in an AG region. The AG, as shown, is disposed adjacent to the first S/D region $244_2$ of the FG. An AG well 207 is disposed below the AG. The AG well, in one embodiment, is a first polarity typed doped well. The AG well, for example, is disposed below the isolation region 260 separating the AG region from the cell region. The AG well may be 1E12-1E13 cm$^{-3}$ doped well. The AG may have a different bias well that is lightly doped and grounded. Providing any other configurations may also be useful.

As for the AG, it includes an AG electrode 351 over an AG dielectric. The AG electrode may be a polysilicon AG electrode and the AG dielectric is a composite AG dielectric having a thermal oxide first AG dielectric 355 disposed below a ferroelectric second AG dielectric 357. The characteristics, such as properties and thicknesses, of the AG dielectric may be similar to those of the CG dielectric. Providing AG dielectric and CG dielectric having different characteristics may also be useful.

The AG is coupled to the FG. In one embodiment, the AG electrode is formed from the same polysilicon layer $256_2$ as the FG electrode. As shown, the FG electrode is an L-shaped polysilicon, serving as the AG and FG electrode.

In one embodiment, the first S/D regions of the gates serves as cell terminals of the NVM cell. The first S/D region of the CG serves as a first cell terminal and the first S/D region of the FG serves as a second cell terminal. The S/D regions and gate electrodes may include metal silicide contacts, such as nickel-based silicide contacts. Other types of metal silicide contacts may also be useful.

A contact dielectric layer 220 is disposed over the substrate, covering the substrate and gates. The contact dielectric layer may be a silicon oxide layer formed by chemical vapor deposition (CVD). Other types of dielectric layers may also be useful. The contact dielectric layer, for example, serves as the first contact level of a BEOL dielectric layer having a plurality of ILD levels. As shown, contacts 222 are disposed in the contact dielectric layer. The contacts are coupled to the cell terminals. In addition, a contact may be provided which is coupled to the CG. In other embodiments, no contact may be provided for coupling to the AG. For example, the AG may be coupled through the device well.

The contact to the first cell terminal is coupled to a bitline (BL) in a metal level above, the contact to the second cell terminal is coupled to a source line (SL) in a metal level above and the contact coupled to the CG is coupled to a word line (WL) in a metal level above. Lines which are perpendicular, such as WL and BL, are provided on different metal levels.

As described, the CG dielectric includes a ferroelectric second CG dielectric; the AG dielectric includes a ferroelectric second AG dielectric. The ferroelectric second CG dielectric and ferroelectric second AG dielectric are configured to provide negative capacitance. This enables a gate coupling ratio of 1 or greater.

Figure 4A:
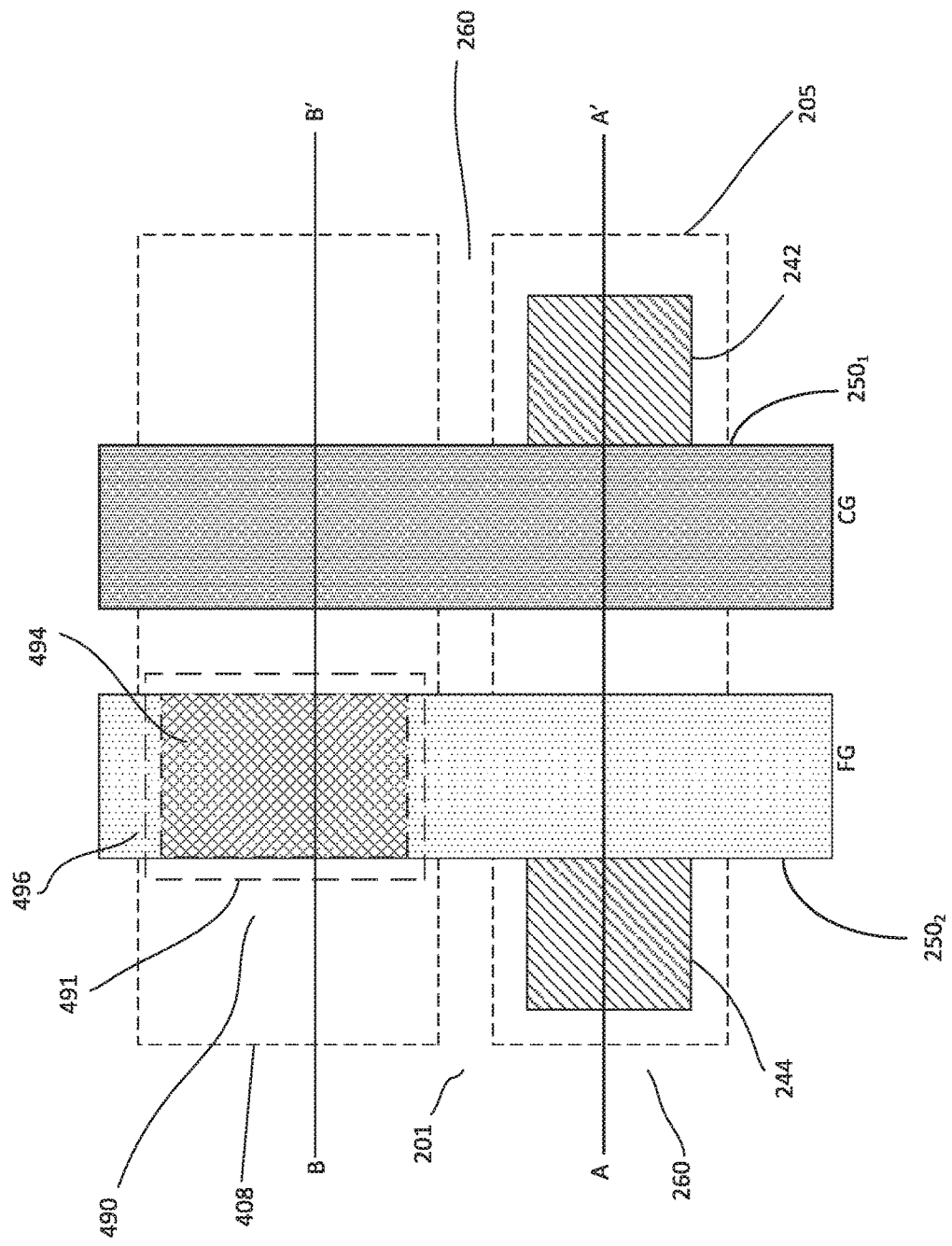
FIGS. 4a-4c show top and cross-sectional views of yet another embodiment of a NVM cell.
Figure 4B:
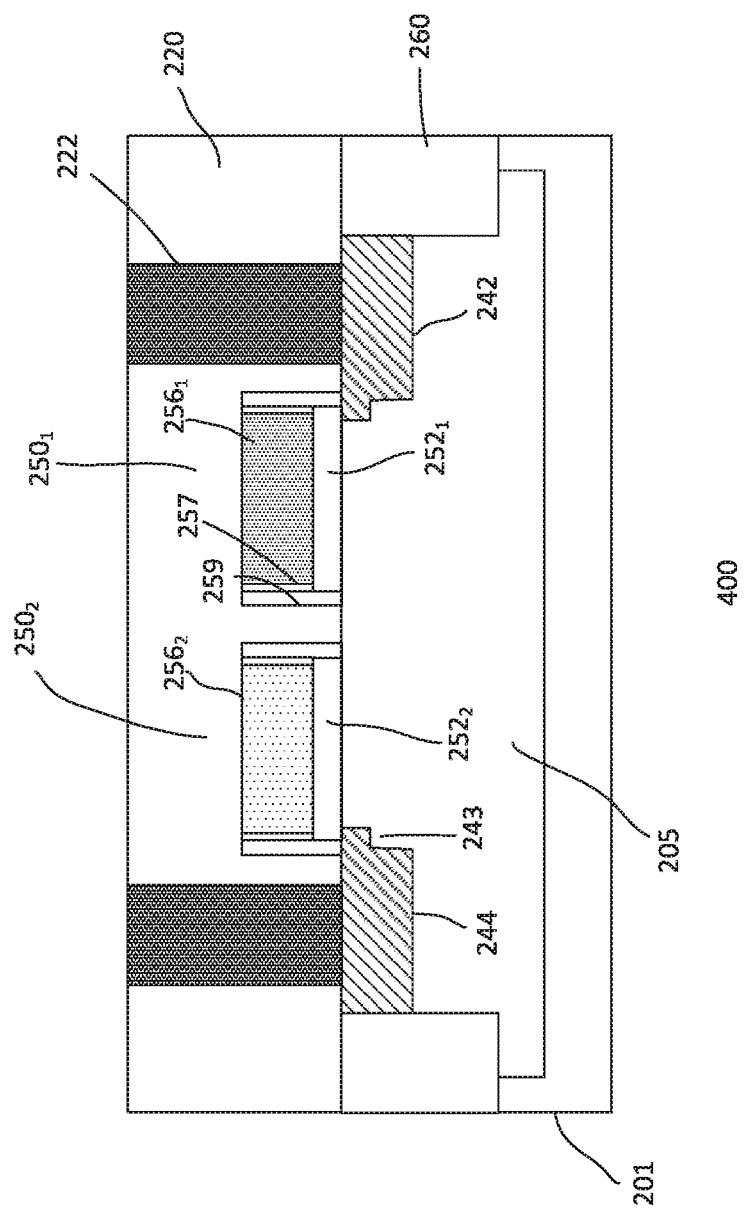
Figure 4C:
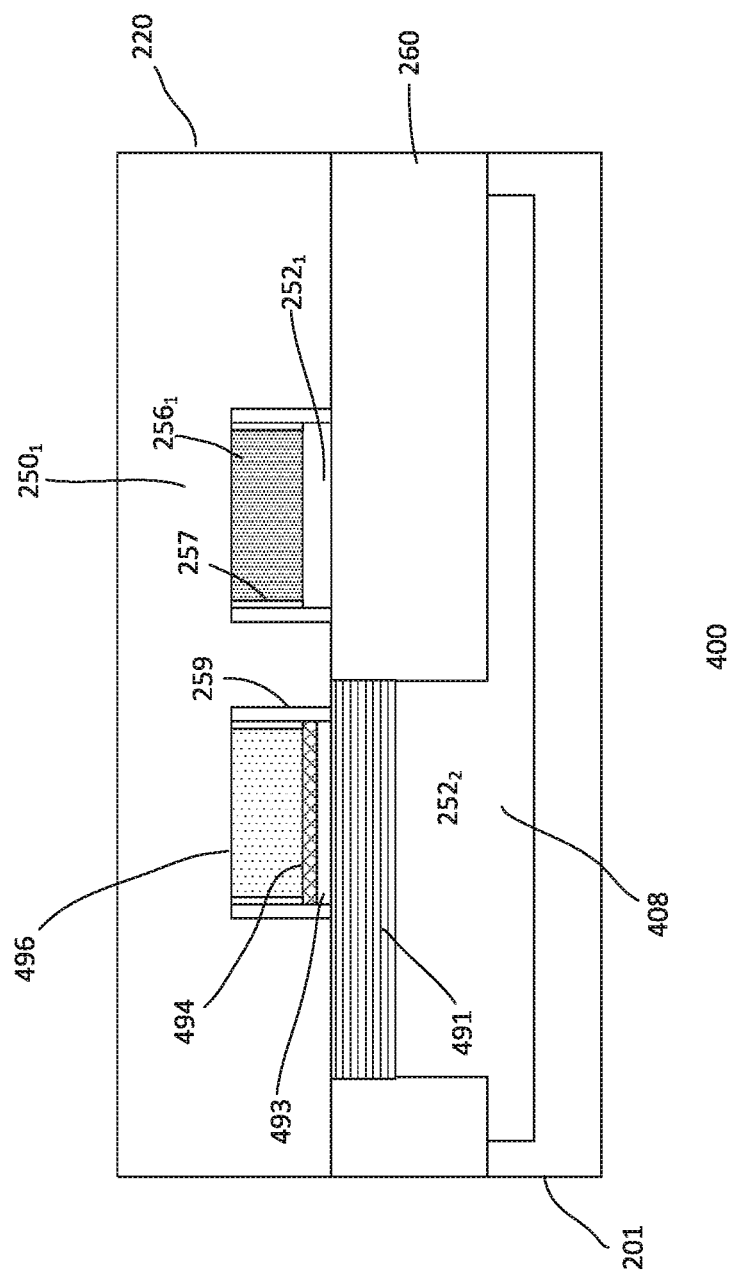

FIGS. 4a-4c show simplified top and cross-sectional views of an embodiment of a device 400. The cross-sectional view of FIG. 4b is along A-A' and the cross-sectional view of FIG. 4c is along B-B'. The device, for example, is an integrated circuit (IC). As shown, the device includes a multi-gate NVM cell. The NVM cell is similar to the NVM cells described in FIGS. 1a-1c, FIGS. 2a-2b and FIGS. 3a-3c. Common elements may not be described or described in detail.

The NVM cell is disposed in the cell region of a substrate 201. The cell region, for example, is part of an array region having a plurality of memory cells. The substrate may include other types of device regions. An isolation region 260, such as an STI region, surrounds the cell region to isolate it from other device regions.

A cell device well 205 is disposed in the substrate in the cell region. A deep isolation well (not shown) may be provided for the cell region. The deep isolation well isolates the cell well from the substrate. The substrate may include other device wells for other types of devices. For example, other device wells may be provided for other device regions of the substrate.

The NVM cell includes a CG $250_1$ and a FG $250_2$ disposed on the substrate in the device region. The FG includes a FG electrode $256_2$ disposed over a FG dielectric $252_2$. The FG electrode may be a polysilicon FG electrode. As for the FG dielectric, it may be a thermal silicon oxide FG dielectric. As for the CG, it includes a CG electrode $256_1$ disposed over a CG dielectric $252_1$. The CG electrode may be a polysilicon CG electrode and the CG dielectric may be a thermal oxide CG dielectric. The CG and FG electrodes may be formed from the same polysilicon layer; the CG and FG dielectrics may be formed from the same thermal oxide layer. In one embodiment, the CG dielectric may be a composite material. Other material for the CG dielectric may also be useful.

A gate includes dielectric gate sidewall spacers 259. For example, both FG and CG include gate sidewall spacers. In one embodiment, the CG and FG includes sidewall oxidation 257. The sidewall oxidation in CG is disposed between the gate sidewall spacers and CG electrode sidewalls. The sidewall oxidation in FG is disposed between the gate sidewall spacers and FG electrode sidewalls.

As shown, the memory cell includes first and second gates $250_1$ and $250_2$ disposed between first and second cell terminals 260 and 270. The first gate serves as a CG and the second gate serves as a FG. In one embodiment, the first and second gates are disposed in very close proximity to each other and between first and second S/D regions or terminals and in close proximity to each other with no common S/D regions therebetween. For example, the first S/D region 242 is disposed adjacent to a first side of the first gate and the second S/D region 244 is disposed adjacent to a second side of the second gate. In some embodiments, a gate may be disposed between first and second S/D regions. For example, the first gate may be disposed between first and second S/D regions; the second gate may be disposed between first and second S/D regions. The first and second gates may include a common second S/D region. Providing other configurations for the gates and S/D regions or terminals may also be useful. The S/D regions are heavily doped first polarity type doped regions. In one embodiment, a S/D region includes lightly doped (LD) extension regions 243. The LD extension region extends under the gate while the heavily doped S/D regions is aligned with the gate sidewall spacers. For example, the gate sidewall spacers facilitate in forming the S/D regions.

In one embodiment, the NVM cell includes a coupling capacitor (CC) 490 in a CC region. The CC, as shown, is disposed adjacent to the CG. For example, the CG extends beyond the cell well along the length direction of the CG. For example, this portion of the CG is disposed over an isolation region 260. A CC well 408 is disposed below the AG and the CG which extends beyond the cell well. The cell and CC wells are isolated from each other by an isolation region 260. The CC well, in one embodiment, is a second polarity typed doped well for a first polarity doped cell well. For example, the polarity type of the CC well is n-type, opposite to that of the NVM cell polarity type, which may be p-type. The CC well, for example, is disposed below the isolation region 260 separating the CC region from the cell region. Other dopant concentrations of the AG well may also be useful.

The CC includes capacitor dielectric between a bottom capacitor plate 491 and a top capacitor plate 496. The bottom capacitor plate is a heavily doped first polarity type doped region in the CC well while top capacitor plate may be part of the FG electrode which extends beyond the cell well along the length direction. The bottom capacitor plate, as shown, extends in a width direction beyond the top capacitor plate to provide access. As for the capacitor dielectric, it is a composite capacitor dielectric having a thermal oxide first capacitor dielectric 493 disposed below a ferroelectric second capacitor dielectric 494. The composite capacitor dielectric may be similar to the CG or AG dielectric described in FIGS. 3a-3c.

In one embodiment, the first S/D regions of the gates serves as cell terminals of the NVM cell. The first S/D region of the CG serves as a first cell terminal and the first S/D region of the FG serves as a second cell terminal. The S/D regions, gate electrodes and exposed portion of the bottom capacitor plate may include metal silicide contacts, such as nickel-based silicide contacts. Other types of metal silicide contacts may also be useful.

A contact dielectric layer 220 is disposed over the substrate, covering the substrate and gates. The contact dielectric layer may be a silicon oxide layer formed by chemical vapor deposition (CVD). Other types of dielectric layers may also be useful. The contact dielectric layer, for example, serves as the first contact level of a BEOL dielectric layer having a plurality of ILD levels. As shown, contacts 222 are disposed in the contact dielectric layer. The contacts are coupled to the cell terminals, CG and exposed bottom capacitor plate.

The contact to the first cell terminal is coupled to a bitline (BL) in a metal level above, the contact to the second cell terminal is coupled to a source line (SL) in a metal level above and the contact coupled to the CG is coupled to a word line (WL) in a metal level above. The bottom capacitor electrode may be coupled to ground. Lines which are perpendicular, such as WL and BL, are provided on different metal levels.

As described, the capacitor dielectric includes a ferroelectric second capacitor dielectric; the AG dielectric includes a ferroelectric second AG dielectric. This enables a gate coupling ratio of 1 or greater.

Figure 5A:
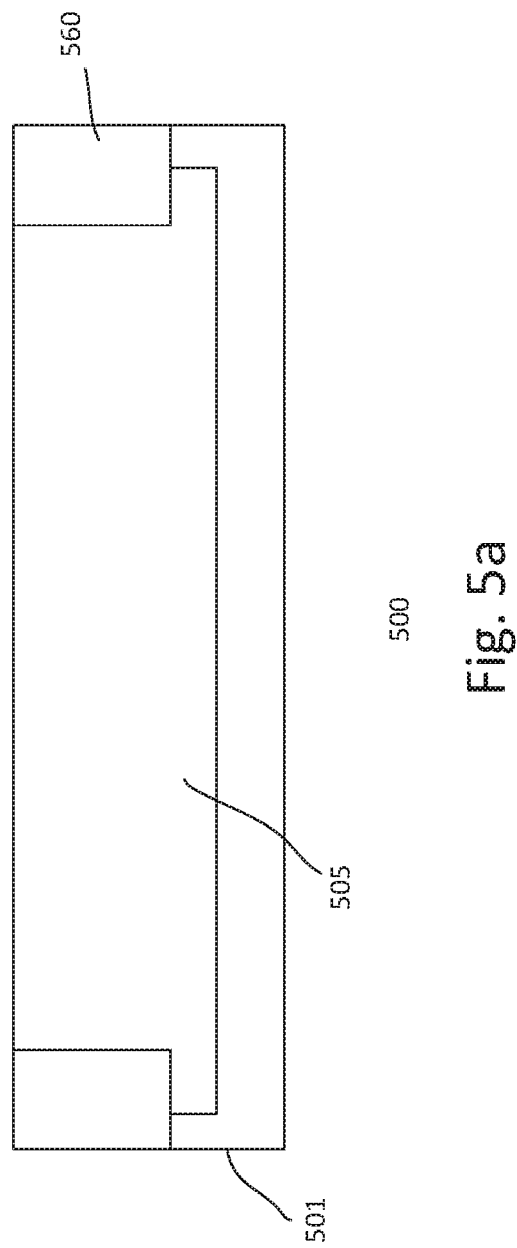
FIGS. 5a-5f show cross-sectional views of a process for forming a device.

FIGS. 5a-5f show cross-sectional views of an embodiment of a process for forming a device 500. The device, for example, is similar to that described in FIGS. 1a-1c and FIGS. 2a-2b. Common elements may not be described or described in detail. Referring to FIG. 5a, a substrate 501 is provided. The substrate, in one embodiment, is a silicon substrate. The substrate, for example, may be a semiconductor substrate, such as a silicon substrate. Other types of substrates or wafers may also be useful. For example, the substrate may be a silicon germanium (SiGe), germanium (Ge), a gallium arsenide (GaAs), or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations as well as an undoped substrate, may also be useful.

The substrate, as shown, is prepared with a cell region in which a NVM cell is formed. Preparing the cell region may optionally include forming a deep isolation well. The deep isolation well, for example, may serve to isolate the cell region from the substrate. The isolation well includes an opposite polarity type dopant than the doped substrate. For example, in the case of a lightly doped p-type substrate, the deep isolation well may be n-type. For example, the n-type deep isolation well is implemented by an implant mask. The dopant concentration of deep isolation well may be about 1E16 to 1E17 $cm^{-3}$. Other dopant concentrations for the deep isolation well may also be useful. The depth of the deep isolation well is sufficient to isolate the device regions from the substrate. The depth, for example, may be about 2.5 μm. Other depths for the deep isolation well may also be useful. Forming the deep isolation well may be achieved by implanting isolation well dopants. In some cases, multiple implants may be employed to form the deep isolation well.

An isolation region 560 may be formed in the substrate. The isolation region, for example, is shallow trench isolation (STI) region. Other types of isolation regions may also be formed. A STI region surrounds a device region. For example, a cell isolation region surrounds the cell region. In one embodiment, the isolation also defines an assist gate (AG) region. Various processes can be employed to form the STI regions. For example, the substrate can be etched using etch and mask techniques to form isolation trenches which are then filled with dielectric materials such as silicon oxide by chemical vapor deposition (CVD). Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful.

A cell well 505 is formed in cell region. In one embodiment, the cell well includes second polarity type dopants for a first polarity type NVM cell. The cell well may be a lightly or an intermediately doped first polarity type doped cell well. The cell well may have a depth which is deeper than the bottom of the isolation region but shallower than the deep isolation well.

The cell well may be formed by implanting second polarity type dopants. An implant mask may be used to implant the second polarity type dopants. For example, the implant mask exposed the cell region in which dopants are to be implanted. An anneal is performed after forming the device wells. The anneal activates the dopants.

As described, the process is for preparing the cell region and the AG region. Preparing other device regions, such as low voltage (LV), medium voltage (MV) and high voltage (HV) device regions may also be useful. Isolation regions may be formed to isolate the different regions. Implants may be performed to form the device wells. Separate implant processes may be employed to form different doped or different types of device wells.

Figure 5B:
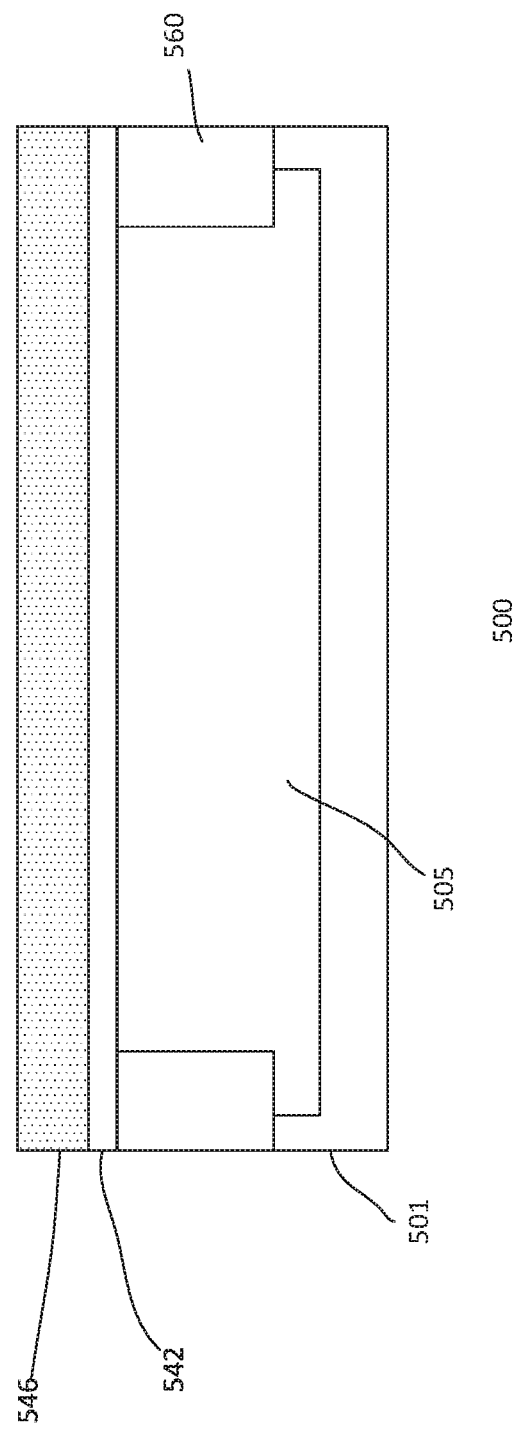

Referring to FIG. 5b, gate layers are formed on the substrate. As shown, a floating gate (FG) dielectric layer 542 is formed on the substrate. The FG dielectric may be formed by thermal oxidation. A FG electrode layer 546 is formed on the substrate over the FG dielectric layer. The FG electrode layer may be a polysilicon formed by CVD.

Figure 5C:
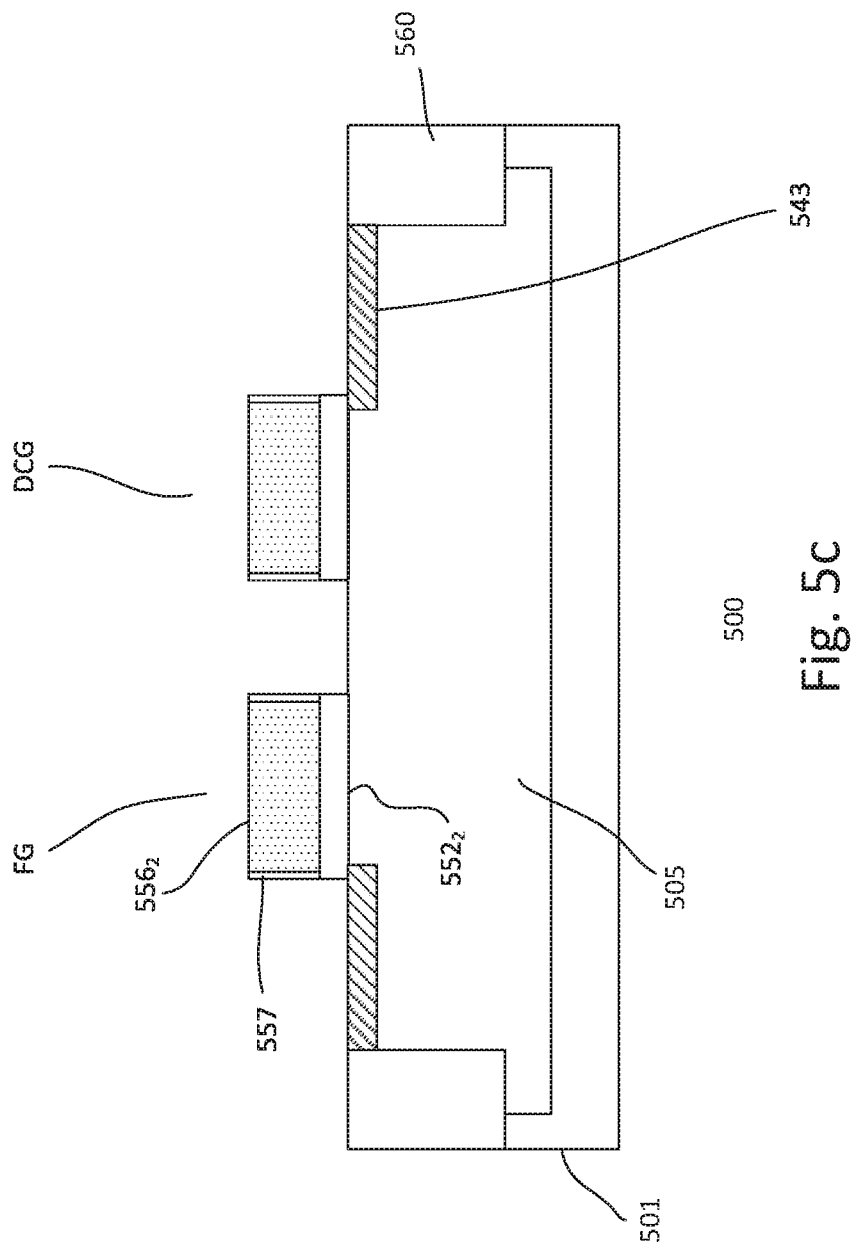

In FIG. 5c, the gate layers are patterned to form gates. In one embodiment, the gate layers are patterned to form a FG and a dummy CG (DCG). Patterning the gate layers may also form gates in other device regions. To form the gates, mask and etch techniques may be used. For example, a soft mask, such as a photoresist mask, may be formed over the gate electrode layer. An exposure source may selectively expose the photoresist layer through a reticle containing the desired pattern. After selectively exposing the photoresist layer, it is developed to form openings corresponding to the location where the gate layers are to be removed. To improve lithographic resolution, an anti-reflective coating (ARC) may be used below the photoresist layer.

The patterned mask layer serves as an etch mask for a subsequent etch process. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, a RIE is employed to pattern the gate layers to form the LV and MV gates. The patterning process may also be used for other gates in other device regions. After patterning the gate layers, the etch mask is removed, for example, by ashing. Other techniques for removing the etch mask may also be useful.

A thermal oxidation process is performed to form oxide liner on sidewalls of the gate electrodes of the gates. The thermal oxidation process also forms an oxide liner on top of the gate electrodes as well as exposed surface of the substrate. The oxide liner lining the exposed substrate may serve as an implant screen oxide.

An extension implant using a lightly doped (LD) extension implant mask is performed to form LD extension regions 543 in the substrate adjacent to the gates. The extension regions extend underneath the gate. For example, an angled implant, such as a quad angled implant, may be employed to form the LD extension regions. The extension regions are lightly doped with first polarity type dopants.

Figure 5D:
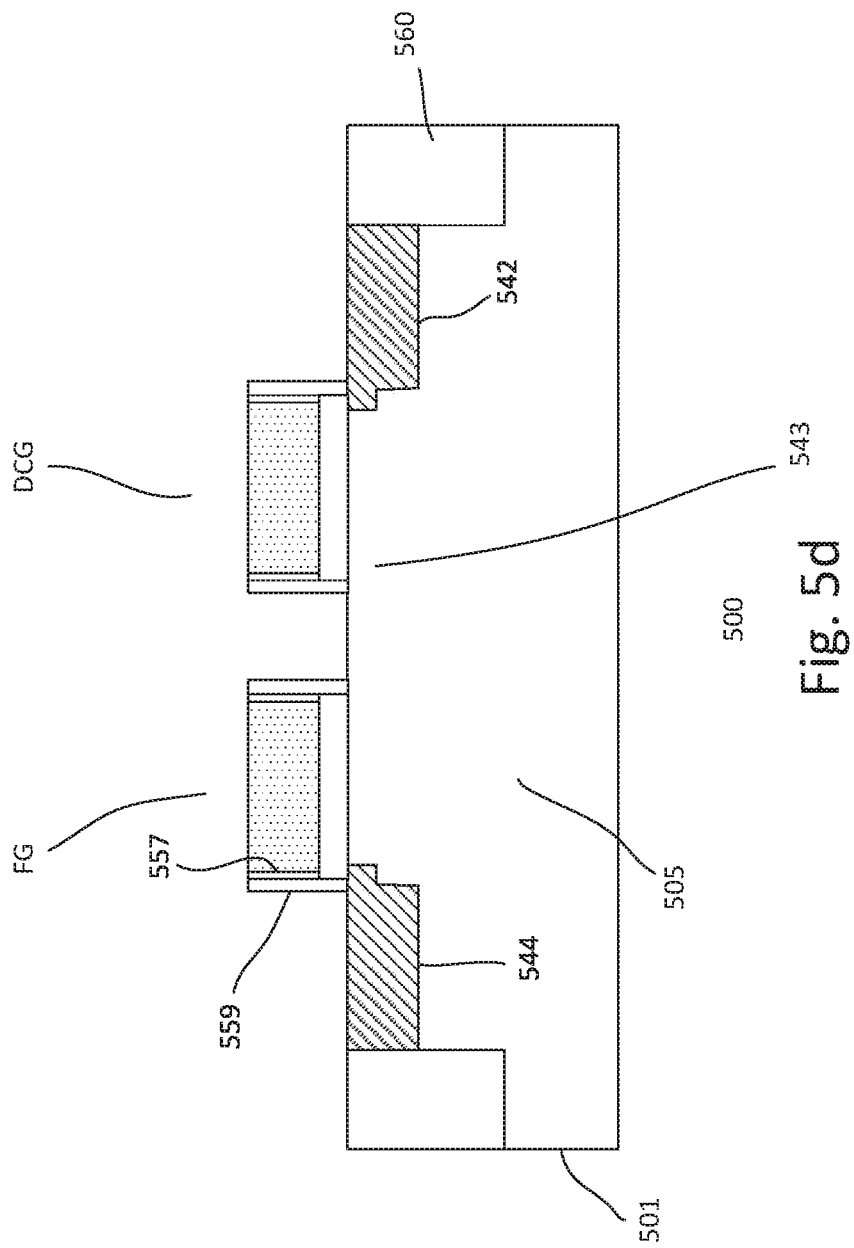

In FIG. 5d, a dielectric spacer layer is formed on the substrate. In one embodiment, the spacer layer includes a nitride layer lining the substrate and gates. The spacer layer may be formed by CVD. The thickness of the spacer layer may be equal to a thickness of the spacers. For example, the thickness may be about 100 nm. Other thicknesses may also be useful. An anisotropic etch is performed, removing horizontal portions of the spacer layer to leave gate sidewall spacers 559 on sidewalls of the gate.

A source/drain (S/D) implant is performed using an S/D implant mask to form first S/D regions 542 and 544 adjacent to opposing sides of the gates. The S/D implant mask may be formed using the same reticle which is used to form the LD extension implant mask.

Figure 5E:
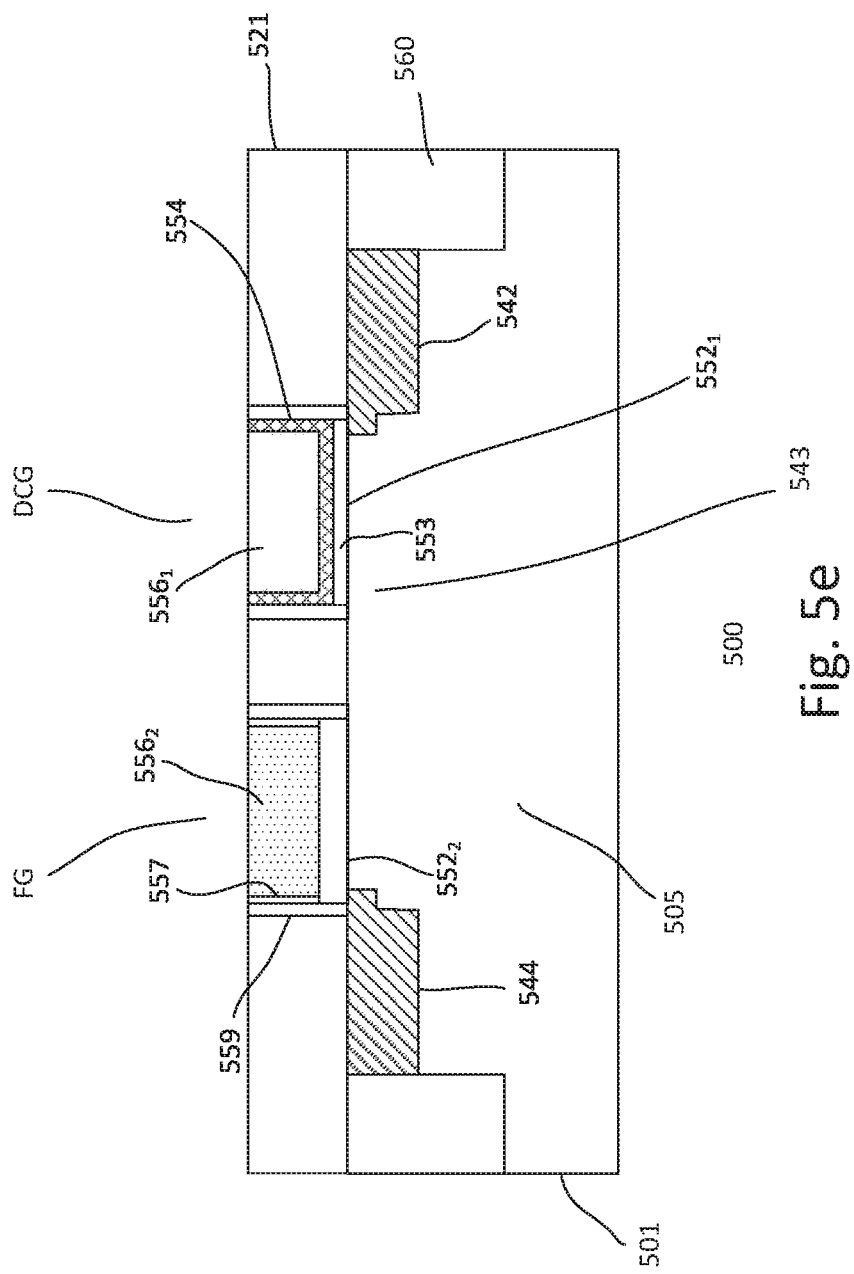

In FIG. 5e, metal silicide contacts may be formed on terminals or contact regions. For example, metal silicide contacts may be provided on exposed top surface of the gate electrodes and exposed S/D regions. Metal silicide contacts may also be formed in other contact regions for other devices as well as well contacts. The silicide contacts, for example, may be nickel-based silicide contacts. Other types of metal silicide contacts may also be useful. For example, the metal silicide contact may be cobalt silicide (CoSi). The silicide contacts may be about 50-300 Å thick. Other thickness of silicide contacts may also be useful. The silicide contacts may be employed to reduce contact resistance and facilitate contact to the back-end-of-line (BEOL) metal interconnects.

To form the silicide contacts, a metal layer is deposited on the surface of the substrate. The metal layer, for example, may be cobalt or an alloy thereof. Other types of metallic layers, such as nickel, or alloys thereof, may also be used. The metal layer can be formed by physical vapor deposition (PVD). Other types of metal elements that can be formed by other types of processes can also be useful.

An anneal may be performed. The anneal diffuses the metal dopants into the active substrate, forming a silicide layer. Excess metal not used in the silicidation of the active surface is removed by, for example, a wet removal process. For example, unreacted metal material is removed selectively to form the silicide contacts.

A first dielectric layer 521 is formed on the substrate. The dielectric layer covers the substrate and gates. The dielectric layer may be a silicon oxide dielectric layer formed by CVD. A planarizing process, such as CMP, is performed to form a planar top surface with the first dielectric layer and top of the gates. In one embodiment, the planarizing process also removes the silicide contact over the top of the gates.

The DCG is removed using a DCG etch mask. For example, an anisotropic etch, such as RIE, is used to remove the exposed DCG. The etch also reduces the thickness of the gate dielectric layer under the DCG electrode. The remaining DCG dielectric forms the first control gate (CG) dielectric 553. After removing the DCG and a portion of the DCG dielectric, the DCG etch mask is removed.

The process continues, in one embodiment, by forming a metal gate with a ferroelectric second CG dielectric. In one embodiment, a ferroelectric layer is formed on the substrate. The ferroelectric layer lines the dielectric layer and dummy trench formed by removal of the DCG. Subsequently, a metal gate electrode layer is formed over the substrate, filling the dummy trench and covering the ferroelectric layer over the first dielectric layer. A planarizing process, such as CMP removes excess metal gate electrode material and ferroelectric layer, forming a planar top surface which is coplanar with the first dielectric layer, FG and CG.

Figure 5F:
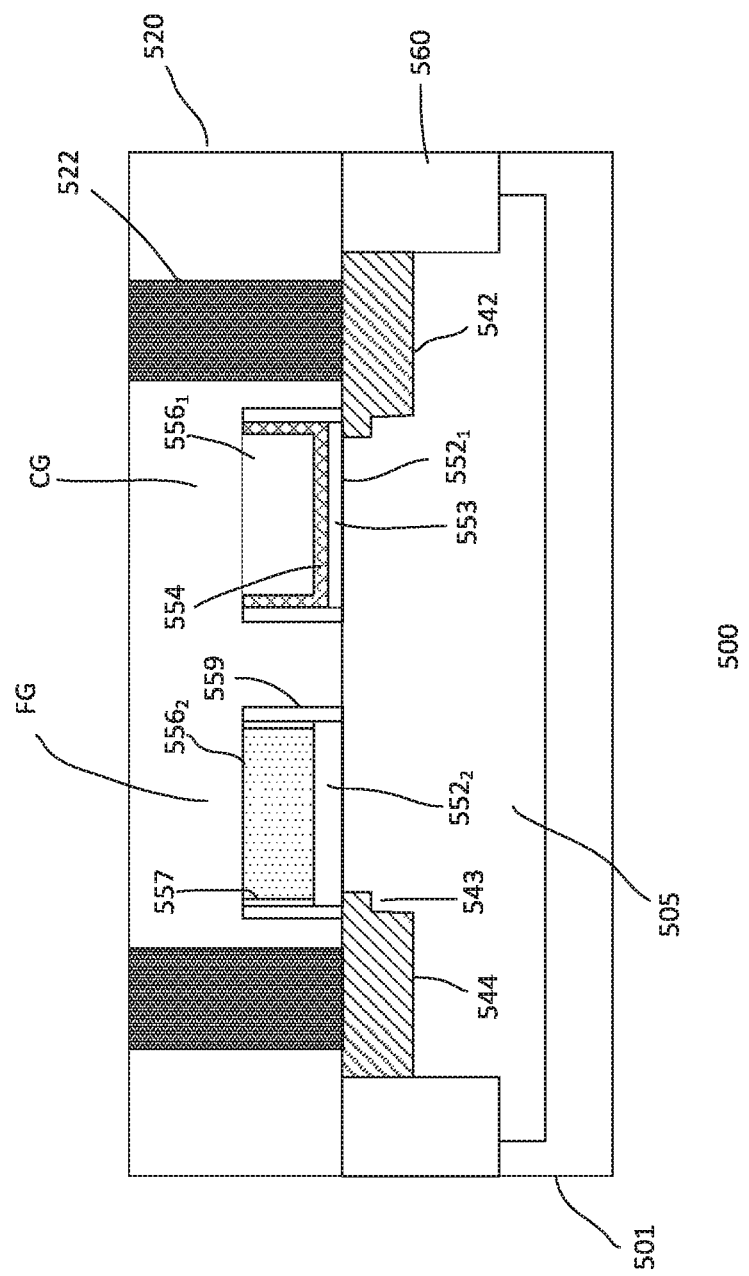

Referring to FIG. 5f, a second dielectric layer is formed over the substrate, covering the first dielectric layer and gates. The first and second dielectric layers form a first contact dielectric level 520 of the BEOL dielectric. As shown, contacts 522 are formed to contact regions on the substrate as well as the CG. The contacts may be formed by etching via openings in the first contact dielectric layer, filling it with a conductive material, such as tungsten. Other types of conductive materials may also be useful. Excess conductive material may be removed by, for example CMP.

Thereafter, additional BEOL processing is performed to complete forming the device. Such processes may include, for example, additional interlevel dielectric (ILD) levels, final passivation, dicing, packaging and testing. Other or additional processes may also be included.

Figure 6C:
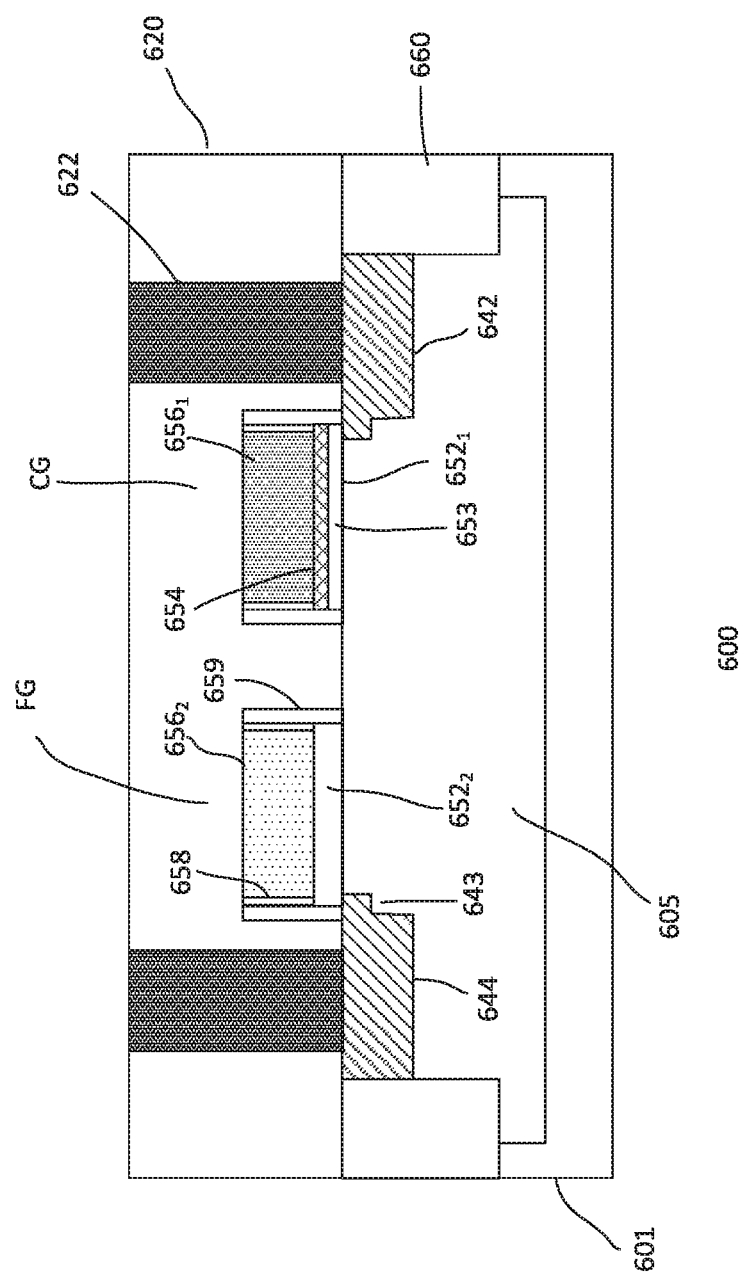

FIGS. 6a-6c show cross-sectional views of an embodiment of a process for forming a device 600. The device, for example, is similar to that described in FIGS. 1a-1c, FIGS. 2a-2b, FIGS. 3a-3c, FIGS. 4a-4c and FIGS. 5a-5f. Common elements may not be described or described in detail.

Referring to FIG. 6a, a substrate 501 is provided. The substrate is processed at the stage as described in FIG. 5c. For example, the substrate is processed to define a cell region and an AG region. The definition of the regions may be achieved with isolation regions. In addition, the cell region includes a cell well 505 and the AG region includes an AG well. The cell well is a second polarity type well while the AG well is a first polarity type well. The different wells are formed using different implant processes. Other wells may be formed for other device regions.

A gate dielectric layer is formed on the substrate. The gate dielectric layer includes a storage dielectric layer 642 in the cell region for the FG and composite dielectric layer in the cell region for the CG and the AG regions. In one embodiment, a storage gate dielectric layer is formed on the substrate, covering all regions of the substrate. The storage gate dielectric layer is patterned to reduce a thickness in the CG portion of the cell region and AG region to form a first dielectric layer 653 of the composite dielectric layer. A ferroelectric layer 654 is then formed over the substrate. A planarization process, such as CMP, is performed to form a planar top surface between the ferroelectric layer in the CG portion and AG region with the storage gate dielectric layer.

Referring to FIG. 6b, a gate electrode layer is formed on the substrate. The gate electrode layer may be a polysilicon layer formed by CVD. The gate electrode layer covers the thermal oxide and the composite gate dielectric layers. The gate layers are patterned to form gates. In one embodiment, the gate layers are patterned to form FG, CG and AG. In one embodiment, the FG and AG are integrated gate formed by the patterning process, as shown in FIGS. 3a-3c. Patterning the gate layers may also form gates in other device regions.

In FIG. 6c, the process continues to form the device. The example, the process continues similar to those describes in FIGS. 5c-5f, except for some minor modifications. The process includes forming oxide gate sidewall liners 658, LD extension regions 643, gate sidewall spacers 659, S/D regions 642 and 644 and metal silicide contacts. A first contact dielectric layer 620 is formed on the substrate. A planarizing process may be performed to provide a planar top surface for the first contact dielectric layer, which serves as a first contact level of a BEOL dielectric. Contacts are formed in the first contact level for contact regions.

Thereafter, additional BEOL processing is performed to complete forming the device. Such processes may include, for example, additional ILD levels, final passivation, dicing, packaging and testing. Other or additional processes may also be included.

The process, as described in FIGS. 6a-6c, may be modified to form a NVM cell, as described in FIGS. 4a-4c. For example, the process may be modified to form a coupling capacitor (CC) region instead of an AG region. Implants may be employed to form the bottom capacitor electrode prior to forming the gates and top capacitor electrode. Other processes are similar except that a contact is formed to the bottom capacitor electrode.

The present disclosure may be embodied in other specific forms without departing from the spirit or essential characteristics thereof. The foregoing embodiments, therefore, are to be considered in all respects illustrative rather than limiting the invention described herein. Scope of the disclosure is thus indicated by the appended claims, rather than by the foregoing description, and all changes that come within the meaning and range of equivalency of the claims are intended to be embraced therein.

What is claimed is:

1. A device structure comprising:
    a substrate including a first region and a second region; and
    a non-volatile memory cell including a first transistor in the first region and a second transistor in the second region, the first transistor including a first gate, a second gate adjacent to the first gate, a first source/drain region adjacent to a sidewall of the first gate, a second source/drain region adjacent to a sidewall of the second gate, a first gate dielectric and a second gate dielectric between the first gate and the substrate, and a third gate dielectric between the second gate and the substrate, the second transistor including a gate, a fourth gate dielectric, and a fifth gate dielectric, the fourth gate dielectric and the fifth gate dielectric between the gate of the second transistor and the substrate,
    wherein the first gate and the second gate of the first transistor are laterally disposed between the first source/drain region and the second source/drain region, the second gate of the first transistor and the gate of the second transistor are shared, and the second gate dielectric of the first transistor and the fourth gate dielectric of the second transistor are comprised of a ferroelectric material.

2. The device structure of claim 1 wherein the ferroelectric material is barium-titanium oxide.

3. The device structure of claim 1 wherein the ferroelectric material is doped hafnium oxide containing silicon.

4. The device structure of claim 1 wherein the ferroelectric material is doped hafnium oxide containing aluminum.

5. The device structure of claim 1 wherein the first gate dielectric, the third gate dielectric, and the fifth gate dielectric comprise silicon oxide.

6. The device structure of claim 1 wherein the first gate is comprised of metal gate electrode material.

7. The device structure of claim 1 wherein the first gate dielectric is thinner than the third gate dielectric.

8. The device structure of claim 7 wherein the first gate dielectric is positioned between the second gate dielectric and the substrate.

9. The device structure of claim 1 wherein the first gate dielectric is positioned between the second gate dielectric and the substrate.

10. The device structure of claim 1 further comprising:
    an interlevel dielectric layer on the substrate, the interlevel dielectric layer covering the non-volatile memory cell; and
    a first contact and a second contact in the interlevel dielectric layer, the first contact coupled to the first source/drain region, and the second contact coupled to the second source/drain region.

11. The device structure of claim 1 wherein the first gate is comprised of polysilicon.

12. A device structure comprising:
    a substrate including a first region and a second region; and
    a non-volatile memory cell including a transistor in the first region and a coupling capacitor in the second region, the transistor including a first gate, a second gate adjacent to the first gate, a first source/drain region adjacent to a sidewall of the first gate, a second source/drain region adjacent to a sidewall of the second gate, the coupling capacitor including a first capacitor plate, a second capacitor plate that is coupled to the second gate, a first capacitor dielectric, and a second capacitor dielectric, and the first capacitor dielectric and the second capacitor dielectric between the first capacitor plate and the substrate, wherein the first capacitor plate is a doped well in the substrate, the first gate and the second gate of the transistor are laterally disposed between the first source/drain region and the second source/drain region, the second gate of the transistor and the first capacitor plate of the coupling capacitor are shared, and the second capacitor dielectric of the coupling capacitor is comprised of a ferroelectric material.

13. The device structure of claim 12 wherein the ferroelectric material is barium-titanium oxide.

14. The device structure of claim 12 wherein the ferroelectric material is doped hafnium oxide containing silicon.

15. The device structure of claim 12 wherein the ferroelectric material is doped hafnium oxide containing aluminum.

16. The device structure of claim 12 wherein the first capacitor dielectric is comprised of silicon oxide.

17. The device structure of claim 12 wherein the first capacitor dielectric is thinner than the second capacitor dielectric.

18. The device structure of claim 17 wherein the first capacitor dielectric is positioned between the second capacitor dielectric and the substrate.

19. The device structure of claim 12 wherein the first capacitor dielectric is positioned between the second capacitor dielectric and the substrate.

20. The device structure of claim 12 further comprising:
an interlevel dielectric layer on the substrate, the interlevel dielectric layer covering the non-volatile memory cell; and
a first contact and a second contact in the interlevel dielectric layer, the first contact coupled to the first source/drain region, and the second contact coupled to the second source/drain region.

* * * * *